(12) United States Patent
Inamori et al.

(10) Patent No.: US 6,229,370 B1
(45) Date of Patent: May 8, 2001

(54) AMPLIFIER

(75) Inventors: Masahiko Inamori, Takatsuki; Kaname Motoyoshi, Nishinomiya; Katsushi Tara, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/446,626

(22) PCT Filed: Apr. 19, 1999

(86) PCT No.: PCT/JP99/02085
§ 371 Date: May 15, 2000
§ 102(e) Date: May 15, 2000

(87) PCT Pub. No.: WO99/56389
PCT Pub. Date: Nov. 4, 1999

(30) Foreign Application Priority Data

Apr. 24, 1998 (JP) .................................................. 10-115621

(51) Int. Cl.[7] ..................................................... H03L 5/00
(52) U.S. Cl. ........................................... 327/308; 333/81 R
(58) Field of Search .................................... 327/308, 306, 327/318, 324, 327, 328, 329, 330, 334, 560–563; 333/81 R

(56) References Cited

U.S. PATENT DOCUMENTS

| 4,890,077 | 12/1989 | Sun | 333/81 A |
|---|---|---|---|
| 5,281,928 * | 1/1994 | Ravid et al. | 333/81 R |
| 5,345,123 * | 9/1994 | Staudinger et al. | 333/81 R |
| 5,666,089 * | 9/1997 | Ehlers | 327/308 |
| 5,767,721 | 6/1998 | Crampton | 327/308 |
| 6,069,503 * | 5/2000 | Doyle | 327/308 |

FOREIGN PATENT DOCUMENTS

| 60160717 | 8/1995 | (JP) . |
|---|---|---|
| 7273598 | 10/1995 | (JP) . |
| 9252234 | 9/1997 | (JP) . |

* cited by examiner

*Primary Examiner*—Toan Tran
(74) *Attorney, Agent, or Firm*—Stevens, Davis, Miller & Mosher, LLP

(57) ABSTRACT

To achieve linear gain control (with a flatness of ±1 dB) over a wide range of 70 dB or greater using a single control voltage in a high frequency section of a mobile terminal transmitter, a signal input part 34 and a signal output part 35 are connected by a signal line 51 containing at least two series variable resistors 51 and 52, parallel variable resistors 53 and 54 are connected between a ground line 57 and the signal input part 34 and signal output part 35, respectively, a gain control line 56 is connected to the variable resistors 51, 52, 53, and 54, reference voltage application parts 23, 27, 31, and 33 are connected to the variable resistors 51, 52, 53, and 54, respectively, and a gain control voltage application part 19 is connected to the variable resistors 51, 52, 53, and 54 via the gain control line 56.

59 Claims, 24 Drawing Sheets

F I G. 3
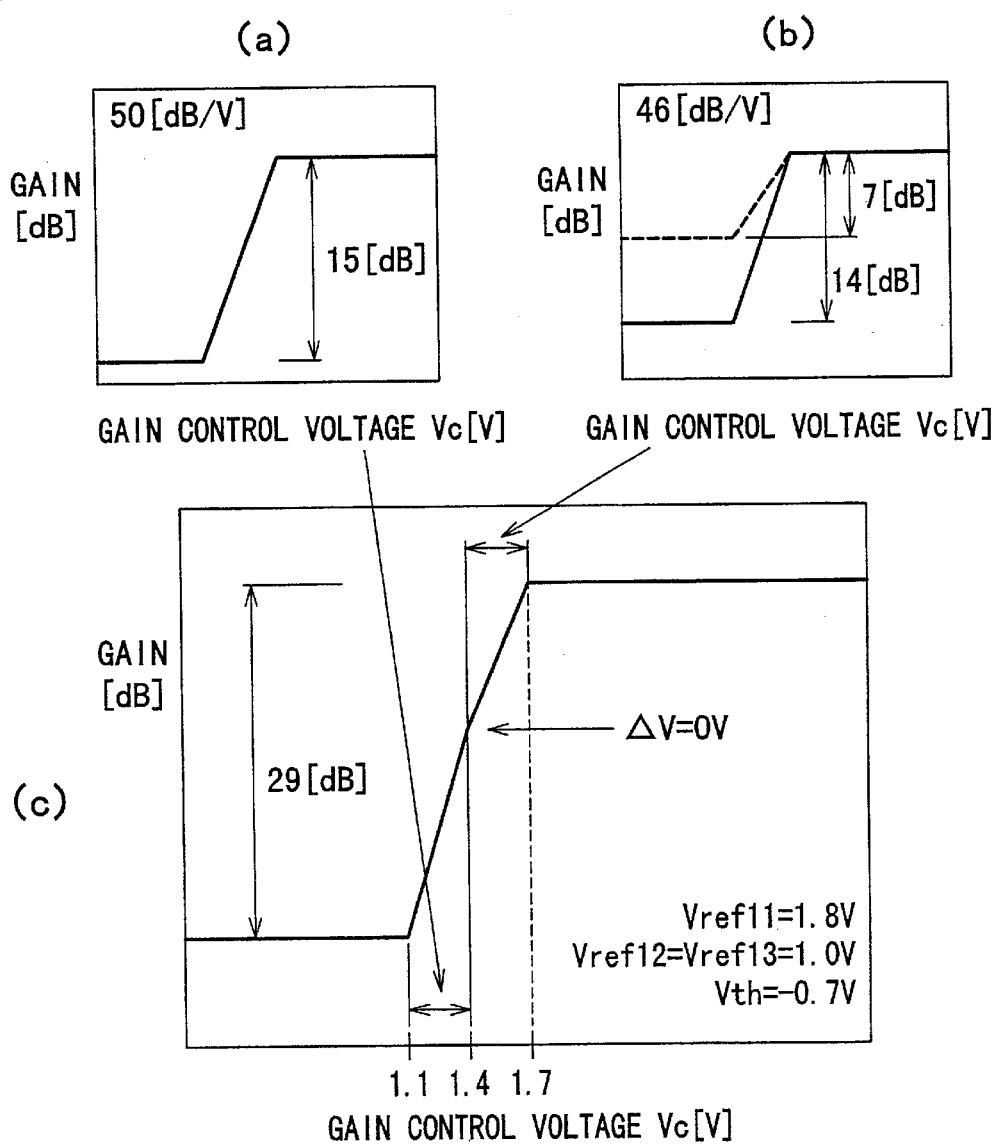

F I G. 1 1
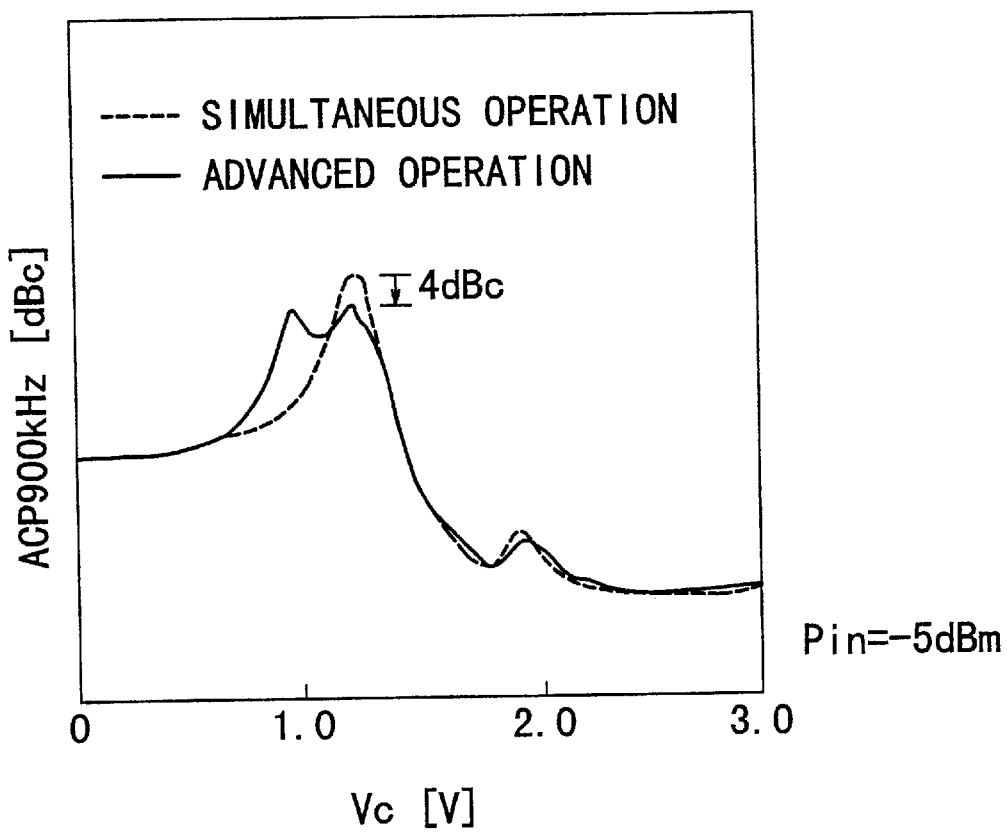

F I G. 1 2
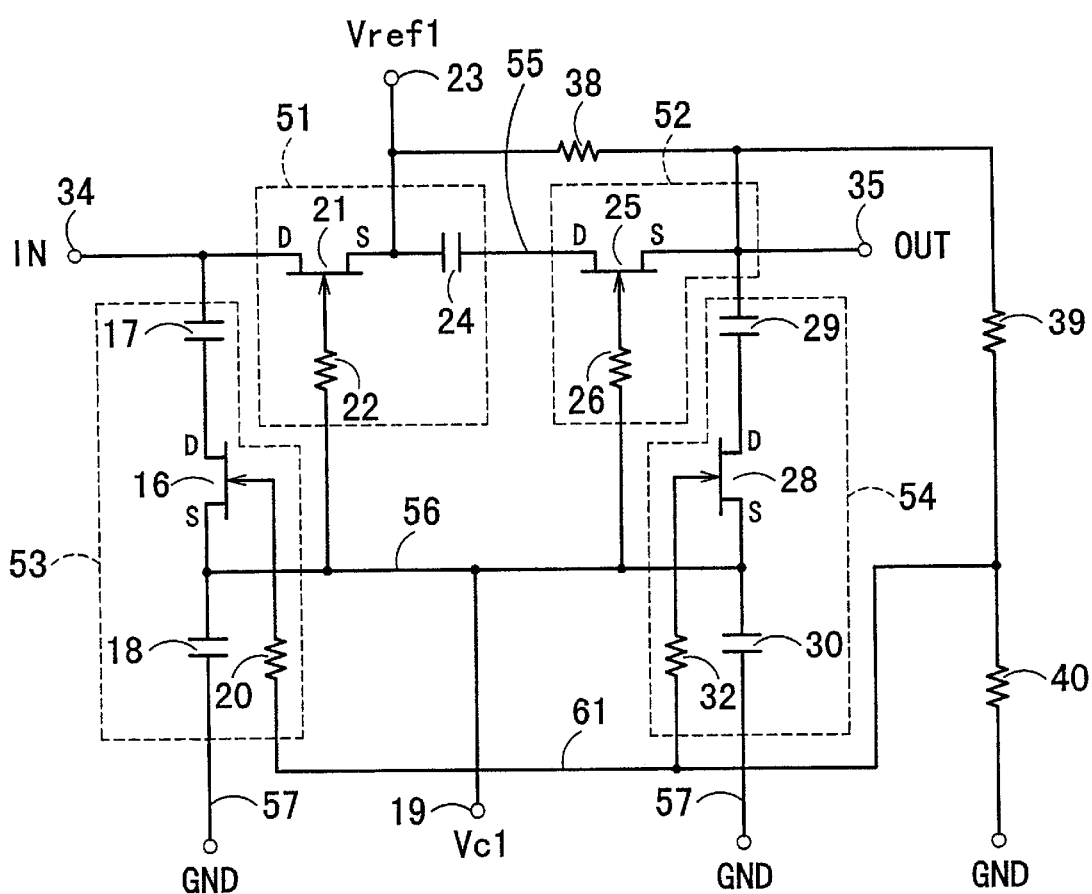

F I G. 1 5
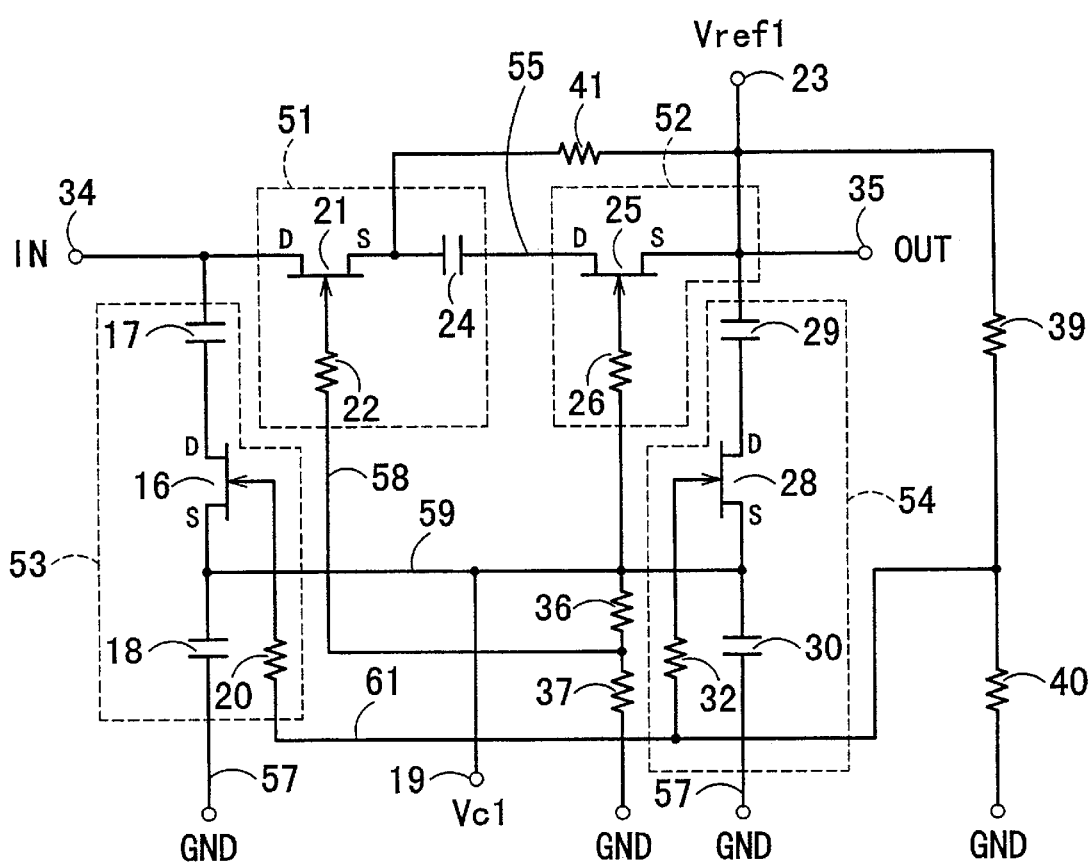

F I G. 1 8
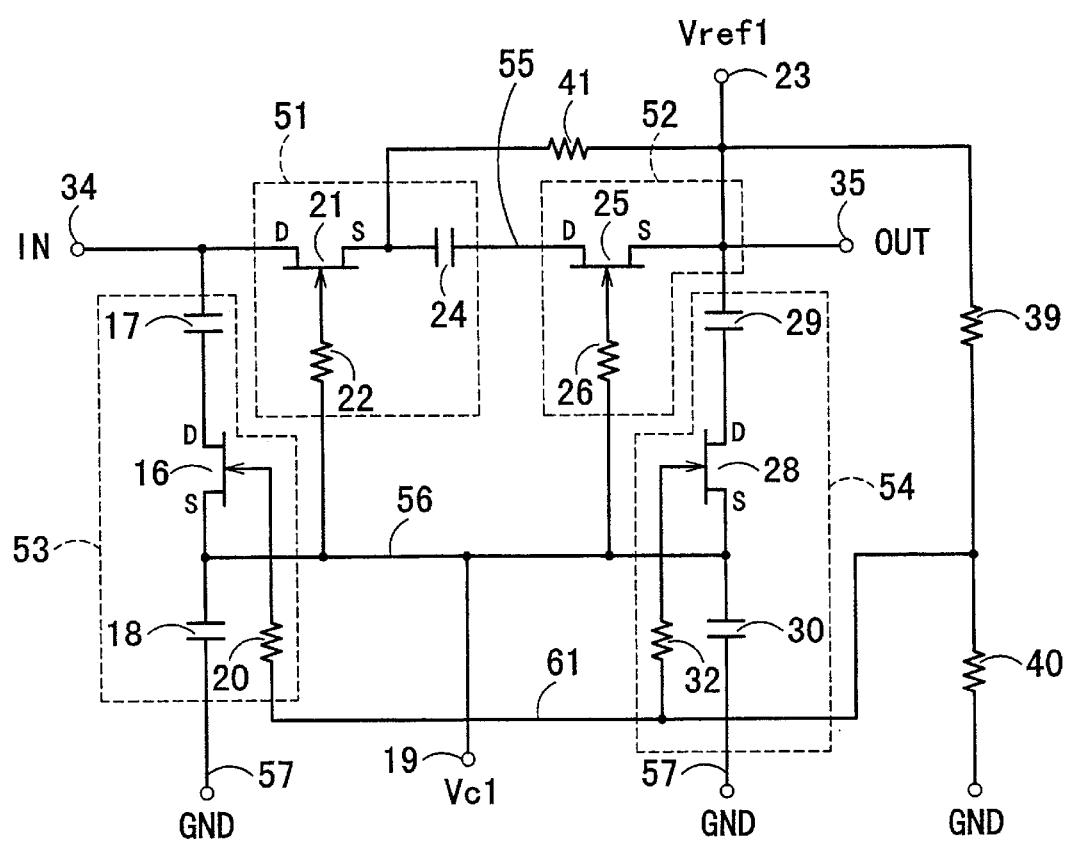

AMPLIFIER

TECHNICAL FIELD

The present invention relates to an amplifier that amplifies high frequency signals and is capable of controlling its gain using a control voltage, and more particularly to an amplifier as a semiconductor device in integrated circuit form for use in a high frequency section of a transmitter in a mobile communication terminal.

BACKGROUND ART

In recent years, a technique called CDMA has been becoming a world standard as access means in the mobile communication field. CDMA communication systems, however, have entailed a big problem called the near-far problem in which as the distance between a mobile terminal and a base station decreases, leakage power to adjacent channels increases, increasing the bit error rate and degrading the communication quality.

To overcome this problem, signal output power must be controlled in accordance with the distance between the mobile terminal and the base station. More specifically, in view of the size of the cell range covered by the base station, gain control over a wide range of 70 dB or greater in terms of gain control width must be performed at the mobile terminal transmitter. Moreover, as a feature of CDMA, extremely precise gain control is performed at any given distance from the base station. Therefore, gain control having excellent linearity with a flatness of ±1 dB is essential.

Furthermore, when gain is attenuated at the mobile terminal transmitter, noise figure increases; therefore, if the gain is attenuated over a wide range of 70 dB or greater at intermediate frequencies lower than about 500 MHz where the carrier signal level is low, it would become difficult to distinguish between the level of the carrier signal and the level of noise signals, resulting in a degradation of communication quality. To avoid this problem, the gain control must be performed at high frequencies higher than about 500 MHz where the carrier signal level is high enough that the level of the carrier signal is easily distinguishable from the level of noise signals.

To accomplish the gain control having excellent linearity with a flatness of ±1 dB over a wide gain control range of 70 dB or greater at a mobile terminal transmitter, it has been practiced in the prior art to manufacture two separate semiconductor devices for performing two different kinds of gain control, i.e., the first packaged semiconductor device for performing control in step-like manner using a point in a high frequency range at which the gain changes largely and the second packaged semiconductor device for performing continuous control using an intermediate frequency range where the gain changes linearly, and to connect the two semiconductor devices together using an external circuit. In a mobile terminal, such gain control is performed using separate semiconductor devices with built-in microcomputer logics.

The reason that the two separate kinds of gain control are performed is that gain control having excellent linearity over a wide range, for example, a flatness of ±1 dB over a gain control range of 70 dB or greater, has been difficult to accomplish using a single semiconductor device forming the high frequency section.

A description will be given below of amplifiers as representative semiconductor devices for performing gain control in a prior art mobile communication terminal transmitter.

FIG. 19 is a circuit diagram showing the configuration of an amplifier (semiconductor device) which performs gain control in steplike manner in a high frequency section of the prior art mobile communication terminal transmitter. With this amplifier, the gain is controlled in steplike manner using a point where the gain changes largely.

As shown in FIG. 19, the amplifier includes a signal line 77 containing a series variable resistor 71 and connecting between an input terminal 14 as a signal input part and an output terminal 15 as a signal output part, and shunt (parallel) variable resistors 72 and 73 are connected between a ground line 76 and the input terminal 14 and output terminal 15, respectively. The ground line 76 is connected to ground GND which is a base potential part. A gain control line 75 is connected to the variable resistors 71, 72, and 73. In this amplifier, a gain control voltage application terminal 4 as a gain control voltage application part is connected to the variable resistors 71, 72, and 73 via the gain control line 75.

The variable resistors 71, 72, and 73 are constructed from field effect transistors 6, 1, and 9 whose gates are connected to resistors 7, 5, and 13, respectively. The drain of the field effect transistor 6 forming the variable resistor 71 is connected to the input terminal 14, and the source is connected to the output terminal 15. On the other hand, the drain of the field effect transistor 1 forming the variable resistor 72 is connected to the input terminal 14 via a capacitor 2, and the source is connected to the ground GND via a capacitor 3 and ground line 76. Likewise, the drain of the field effect transistor 9 forming the variable resistor 73 is connected to the output terminal 15 via a capacitor 10, and the source is connected to the ground GND via a capacitor 11 and ground line 76.

Further, the gate of the field effect transistor 6 forming the variable resistor 71 is connected to the gain control voltage application terminal 4 via the resistor 7 and gain control line 75, the source of the field effect transistor 1 forming the variable resistor 72 is connected to the gain control voltage application terminal 4 via the gain control line 75, and the source of the field effect transistor 9 forming the variable resistor 73 is connected to the gain control voltage application terminal 4 via the gain control line 75. Supply voltage VDD (about 3 V, a battery voltage itself) from a lithium battery or the like is applied to the source of the field effect transistor 6 forming the variable resistor 71, while GND potential is applied via the resistors 5 and 13 to the gates of the field effect transistors 1 and 9 forming the respective variable resistors 72 and 73.

Here, the capacitors 2, 3, 10, and 11 each act to prevent the application of a dc voltage, while the resistors 7, 5, and 13 act to block the penetration of high frequency signals.

In this amplifier, the gain control is performed by adjusting the amount of attenuation, and its functional block intended as an amplifier for raising the gain is not shown in the figure. Therefore, as far as the circuit of FIG. 19 is concerned, the circuit functions as an attenuator.

FIG. 20 shows characteristic diagrams illustrating how the gain control is accomplished in the amplifier of FIG. 19 when the threshold voltage Vth of each of the field effect transistors 6, 1, and 9 is −1.0 V. FIG. 20(a) shows the gain control voltage Vc versus gain (amount of attenuation) characteristic of the field effect transistor (series FET) 6 forming the series variable resistor 71. FIG. 20(b) shows the gain control voltage Vc versus gain (amount of attenuation) characteristics of the field effect transistors (shunt FETs) 1 and 9 forming the parallel variable resistors 72 and 73; the solid line shows the characteristic of the two transistors combined, and the dashed line the characteristic of either alone. FIG. 20(c) shows the gain control voltage Vc versus gain (amount of attenuation) characteristic of the amplifier of FIG. 19, obtained by combining the characteristics of FIGS. 20(a) and 20(b).

When the threshold voltage Vth of each of the field effect transistors 6, 1, and 9 is −1.0 V, as stated above, for the field effect transistors 1 and 9 forming the parallel variable resistors 72 and 73 the gain (amount of attenuation) varies over a range of 14 dB with a slope of 46 dB/V in proportion to the applied gain control voltage Vc when the gain control voltage Vc is varied within the range of 0.7 V to 1.0 V, while for the field effect transistor 6 forming the series variable resistor 71, the gain (amount of attenuation) varies over a range of 15 dB with a slope of 50 dB/V in proportion to the applied gain control voltage Vc when the gain control voltage Vc is varied within the range of 2.0 V to 2.3 V; this means that, within the voltage range of 1.0 V to 2.0 V, gain control is not performed but the gain (amount of attenuation) is maintained constant irrespective of the variation of the applied gain control voltage Vc. That is, gain control voltage section ΔV where no gain control is performed is as wide as 1.0 V.

FIG. 21 shows characteristic diagrams illustrating how the gain control is accomplished in the amplifier of FIG. 19 when the threshold voltage Vth of each of the field effect transistors 6, 1, and 9 is −2.0 V. FIG. 21(a) shows the gain control voltage Vc versus gain (amount of attenuation) characteristic of the field effect transistor (series FET) 6 forming the series variable resistor 71. FIG. 21(b) shows the gain control voltage Vc versus gain (amount of attenuation) characteristics of the field effect transistors (shunt FETs) 1 and 9 forming the parallel variable resistors 72 and 73; the solid line shows the characteristic of the two transistors combined, and the dashed line the characteristic of either alone. FIGS. 21(a) and 21(b) are the same as FIGS. 20(a) and 20(b). FIG. 21(c) shows the gain control voltage Vc versus gain (amount of attenuation) characteristic of the amplifier of FIG. 19, obtained by combining the characteristics of FIGS. 21(a) and 21(b).

When the threshold voltage Vth of each of the field effect transistors 6, 1, and 9 is −2.0 V, as stated above, for the field effect transistor 6 forming the series variable resistor 71 the gain (amount of attenuation) varies over a range of 15 dB with a slope of 50 dB/V in proportion to the applied gain control voltage Vc when the gain control voltage Vc is varied within the range of 1.0 V to 1.3 V, while for the field effect transistors 1 and 9 forming the parallel variable resistors 72 and 73, the gain (amount of attenuation) varies over a range of 14 dB with a slope of 46 dB/V in proportion to the applied gain control voltage Vc when the gain control voltage Vc is varied within the range of 1.7 V to 2.0 V; this means that, within the voltage range of 1.3 V to 1.7 V, gain control is not performed but the gain (amount of attenuation) is maintained constant irrespective of the variation of the applied gain control voltage Vc. That is, gain control voltage section ΔV where no gain control is performed is as wide as 0.4 V.

In the amplifier having the above characteristics, when performing step control, the gain control voltage Vc is varied in steps to vary the gain (amount of attenuation) incrementally by a predetermined amount, and gain control having good linearity (within ±1 dB), for example, over a wide gain control range of 70 dB, is accomplished by combining such step control with the continuous gain control performed at intermediate frequencies.

FIG. 22 shows an example of a step control characteristic diagram for the amplifier, such as described above, that performs gain control in the high frequency section. Usually, the number of gain steps is chosen to be about 2 to 10; in FIG. 22, the gain control width of 30 dB is divided into three steps in increments of 15 dB, i.e., a low mode, a middle mode, and a high mode in increasing order of the gain. Symbols $V_{CL}$, $V_{CM}$, and $V_{CH}$ denote gain control voltages corresponding to the respective modes, and symbol $P_{OUT}$ indicates the magnitude of the output signal. In FIGS. 20 and 21, the gain control width has been shown as being 29 dB, but here the width is rounded up to 30 dB for simplicity of calculation.

On the other hand, for the amplifier (intermediate frequency amplifier) that performs continuous gain control at intermediate frequencies and is used in combination with the amplifier (high frequency amplifier), such as shown in FIG. 19, that performs the steplike gain control, an amplifier using a silicon bipolar transistor is the predominant type, though its specific circuit diagram is not shown here.

With the amplifier that performs gain control using a bipolar transistor, gain control having excellent linearity can be achieved over a relatively wide range at small signal levels because of the characteristic of its circuit configuration. Accordingly, the amplifier used to perform gain control at intermediate frequencies performs continuous control using the characteristic that the gain changes linearly.

FIG. 23 is a continuous control characteristic diagram for the amplifier that performs gain control at intermediate frequencies. As shown in FIG. 23, gain control with excellent linearity of ±1 dB flatness over a relatively wide gain control range of 40 dB or greater can be performed at a small signal level; thus, continuous control is performed at intermediate frequencies for the respective modes in the step control performed at high frequencies. Symbol $V_{CFINE}$ denotes a fine adjusting gain control voltage for the respective modes, and symbol $P_{OUT}$ indicates the magnitude of the output signal.

Further, FIG. 24 is a gain control characteristic diagram for the mobile communication terminal transmitter, showing the characteristic of the step control combined with the continuous control. By combining the respective modes of the step control in FIG. 22 with the continuous control of FIG. 23, gain control having excellent linearity with a flatness of ±1 dB can be performed over a wide gain control range of 70 dB or greater at the mobile communication terminal transmitter.

As described above, to achieve gain control having a wide gain control range of 70 dB or greater and excellent linearity with a flatness of ±1 dB in the mobile communication terminal transmitter, it has been practiced in the prior art to manufacture separately a device for performing step control at high frequencies and a device for performing continuous control at intermediate frequencies, and to connect the two kinds of amplifiers (semiconductor devices), constructed by packaging the respective semiconductor chips, using an external circuit.

The reason for this is that in the prior art configuration described above, since only one stage of series variable resistor 71 formed from the field effect transistor 6 is connected between the input terminal 14 and the output terminal 15, the linear portion of the gain control amount that changes as a function of control voltage cannot be made wider than about 15 to 18 dB and the gain control width is also as small as about 30 dB, and therefore that gain control having a wide gain control range of 70 dB or greater and excellent linearity with a flatness of ±1 dB is difficult to achieve with a single amplifier in the high frequency section of the mobile communication terminal transmitter.

However, using two separate kinds of amplifiers (semiconductor devices) for performing separate gain controls, as described above, has had the following problems.

The first problem is that when the amplifier for performing gain control in the high frequency section is used to perform step control, gain control voltage dead zone Δ where the gain control cannot be performed occurs between the gain control voltage range where the series variable resistor 71 performs a linear gain control operation and the gain control voltage range where the parallel variable resistors 72 and 73 perform a linear gain control operation; accordingly, when changing the gain (amount of attenuation) in steplike manner by changing the gain control voltage Vc in steplike manner, it has been difficult to accomplish highly precise gain control, even if the gain control voltage is changed precisely with respect to the gain (amount of attenuation). In other words, there has been the problem that if precise adjustment of the gain (amount of attenuation) is to be achieved, the selection of the gain control voltage Vc will become complex.

A second problem is that if different kinds of gain controls (step control and continuous control) are used in combination, that is, if different kinds of gain controls (step control and continuous control) are performed using two different kinds of amplifiers (semiconductor devices), since the setting of the gain control voltage Vc in the continuous control is changed at the same time that the mode switches from one mode to the next in the step control, as can be seen from the gain control characteristic diagram of FIG. 24, gain differences occur before and after the mode switching, and the desired flatness characteristic cannot be achieved, thus making it difficult to increase the precision of the gain control. Furthermore, two kinds of control voltage settings become necessary in the microcomputer logic blocks, which adds to complexity. There has also been the problem that the circuit configuration of the mobile communication terminal becomes complex and increases in size.

DISCLOSURE OF THE INVENTION

A first object of the present invention is to provide an amplifier that accomplishes highly precise gain control or permits easy selection of a control voltage when performing step control.

A second object of the present invention is to provide an amplifier that accomplishes linear gain control over a wide range using a single control voltage.

To achieve the first object, the amplifier of the present invention comprises: a signal line containing a series variable resistor, formed for example from a field effect transistor, and connecting between a signal input part and a signal output part; parallel variable resistors and connected between a ground line and the signal input part and signal output part, respectively; a gain control line connected to each of the variable resistors; reference voltage application parts connected to the respective variable resistors; and a gain control voltage application part connected to each of the variable resistors via the gain control line.

According to this configuration, by appropriately setting the reference voltage applied to each variable resistor, gain control voltage section where gain control cannot be performed, existing between the gain control voltage range where the series variable resistor performs a linear gain control operation and the gain control voltage range where the parallel variable resistors perform a linear gain control operation, can be made small when performing the gain control; this achieves highly precise gain control or makes the selection of the control voltage easy when performing step control.

When all the field effect transistors forming the series variable resistor and parallel variable resistors are single-gate devices, if all the field effect transistors forming the series variable resistor and parallel variable resistors are chosen to have the same gate width, the series variable resistor and the parallel variable resistors can be made to have the same gain control characteristics.

When the field effect transistor forming the series variable resistor is constructed from a multi-gate device, the gain control width can be increased while, at the same time, achieving a low distortion design.

Further, when the gain control voltage section where gain control cannot be performed, existing between the gain control voltage range where the series variable resistor performs a linear gain control operation and the gain control voltage range where the parallel variable resistors perform a linear gain control operation, is made smaller in width than 0.15 V, highly precise gain control is accomplished or the selection of the gain voltage is made easy when performing step control.

Moreover, when the values of the voltages applied to the reference voltage application parts connected to the parallel variable resistors are set so that the gain control voltage range where the parallel variable resistors perform a linear gain control operation is concatenated smoothly with the gain control voltage range where the variable resistor performs a linear gain control operation, highly precise gain control is accomplished or the selection of the gain voltage is made easy when performing step control.

Provisions may also be made to apply a common reference voltage to the gates of the field effect transistors of the parallel variable resistors via resistors; in this case, the number of reference voltage sources can be reduced.

To achieve the second object, the amplifier of the present invention employs a similar configuration to that of the above amplifier, except that the series variable resistor, formed, for example, from a field effect transistor and connecting between the signal input part and signal output part, is replaced by two or more variable resistors connected in a multiple stage configuration. In this configuration, a capacitor may be inserted between the field effect transistors forming the multiple series variable resistors.

According to this configuration, the two or more series variable resistors, formed from field effect transistors and connected in a multiple stage configuration, are shifted in operation by an amount equivalent to the width of a linear gain control operation range, the linear operation ranges of the respective series variable resistors are concatenated, and switching between each mode is made while using a single gain control voltage; this eliminates gain differences and achieves highly precise linear gain control operations.

In one configuration where the gain control operations of the two or more series variable resistors, formed from field effect transistors and connected in a multiple stage configuration, are shifted by an amount equivalent to the width of a linear gain control operation range, different reference voltages are applied to the sources of the two or more field effect transistors connected in series. With this configuration, extremely precise gain control is possible, since the gain control is performed using a single gain control voltage. The setting of the gain control operation voltage can be changed as desired.

In another configuration, different voltages are applied to the gates of the two or more field effect transistors connected in series. With this configuration, since the same reference voltage is applied at the sources of the two or more field effect transistors acting as the series variable resistors, precise and linear gain control can be achieved even when there occurs a fluctuation in the reference voltage. The setting of the gain control operation voltage can be changed as desired.

In still another configuration, field effect transistors having different threshold voltages are used for the two or more field effect transistors connected in series. With this configuration, extremely precise gain control is possible, since the gain control is performed using a single gain control voltage. Furthermore, since the same reference voltage is applied at the sources of the two or more field effect transistors acting as the series variable resistors, precise and linear gain control can be achieved even when there occurs a fluctuation in the reference voltage. Moreover, this configuration serves to simplify the circuit configuration, because the number of voltages to be applied can be reduced.

When all the field effect transistors forming the series variable resistors and parallel variable resistors are single-gate devices, if all the field effect transistors forming the series variable resistors and parallel variable resistors are chosen to have the same gate width, the series variable resistors and the parallel variable resistors can be made to have the same gain control characteristics.

When the field effect transistors forming the series variable resistors are constructed from a multi-gate device, the gain control width can be increased while, at the same time, achieving a low distortion design.

Provisions may also be made to apply a common reference voltage to the gates of the field effect transistors of the parallel variable resistors via resistors; in this case, the number of reference voltage sources can be reduced.

Furthermore, if the voltage applied to the reference voltage application part connected to the series variable resistor at the input side is set higher than the voltage applied to the reference voltage application part connected to the series variable resistor at the output side by a value equivalent to the gain control voltage range where the series variable resistor at the output side performs a linear gain control operation, or if the values of the voltages applied to the reference voltage application parts connected to the parallel variable resistors are set so that the gain control voltage range where the parallel variable resistors perform a linear gain control operation is concatenated smoothly with the gain control voltage range where the series variable resistors perform a linear gain control operation, highly precise gain control is accomplished when performing continuous control.

When the voltage applied to the reference voltage application part connected to the series variable resistor at the input side is set higher than the voltage applied to the reference voltage application part connected to the series variable resistor at the output side, the degradation points of the distortion characteristics of the input side series variable resistor, the output side series variable resistor, and the parallel variable resistors can be spread out, eliminating the superimposition of degraded distortion power, and degradation of the distortion characteristics can thus be prevented in combination with the operation of the parallel variable resistors.

The above-described configurations provide means for solving the problems.

In the first configuration described above, by applying the appropriate reference voltage to each of the series variable resistor and parallel variable resistors in the high frequency section, etc. of a mobile communication terminal transmitter, the gain control voltage section where gain control cannot be performed, existing between the linear gain control voltage ranges of the respective variable resistors, can be made small or be eliminated. As a result, highly precise gain control can be accomplished when performing steplike gain control.

In the second configuration described above, the series resistance between the signal input part and the signal output part is increased by the variable resistors formed from the two or more field effect transistors connected in series in a multiple stage configuration in the high frequency section, etc. of a mobile communication terminal transmitter, the series variable resistors formed from the two or more field effect transistors connected in the multiple stage configuration are shifted in operation by an amount equivalent to the width of the linear gain control operation range, the linear operation ranges of the series variable resistors are concatenated, and switching between each mode is made while using a single gain control voltage; with this configuration, the linear gain control range (with a flatness of about ±1 db) for the control voltage can be increased by eliminating gain differences. Furthermore, the gain control operation can be performed with high precision over a wide range. Moreover, by increasing the number of series variable resistor stages, the linear gain control operation (with a flatness of about ±1 db) for the control voltage can be performed with high precision over a wide range of 70 dB or greater.

BRIEF DESCRIPTION OF THE DRAWINGS

FIG. 3 is a diagram showing gain control characteristics for the amplifier of FIG. 2 when the threshold voltage Vth of each of field effect transistors 6, 1, and 9 is −0.7 V, and when Vref11 is set to 1.8 V and Vref12 and Vref13 are both set to 1.0 V.

FIG. 11 is a diagram showing the gain control voltage versus 900 kHz adjacent channel leakage power in the first embodiment of the present invention.

FIG. 12 is a circuit diagram showing the detailed configuration of the amplifier according to the third embodiment of the present invention wherein bias resistors 38, 39, and 40, respectively, are provided so that reference voltages can be applied to the respective variable resistors.

FIG. 15 is a circuit diagram showing the detailed configuration of the amplifier according to the fourth embodiment of the present invention wherein bias resistors 36 and 37 are provided so that different voltages can be applied to the gates of the field effect transistors 21 and 25 forming the respective series variable resistors, while bias resistors 41, 39, and 40, respectively, are provided so that reference voltages can be applied to the respective variable resistors.

FIG. 18 is a circuit diagram showing the detailed configuration of the amplifier according to the fifth embodiment of the present invention wherein bias resistors 41, 39, and 40 are provided so that reference voltages can be applied to the respective variable resistors.

BEST MODE FOR CARRYING OUT THE INVENTION

A first embodiment of the present invention will be described below with reference to drawings.

Figure 1:
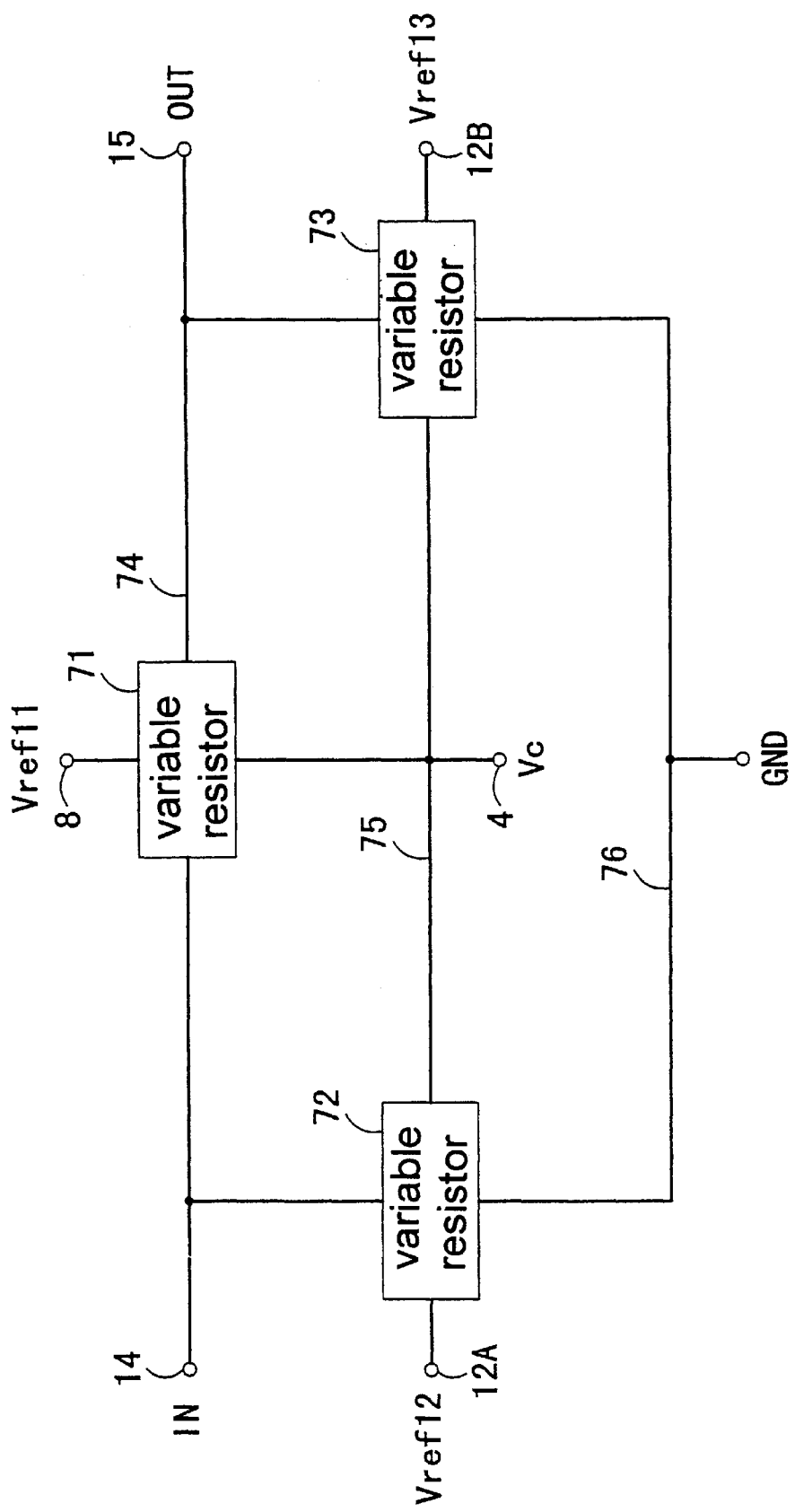
FIG. 1 is a block diagram showing the configuration of an amplifier according to a first embodiment of the present invention.
Figure 2:
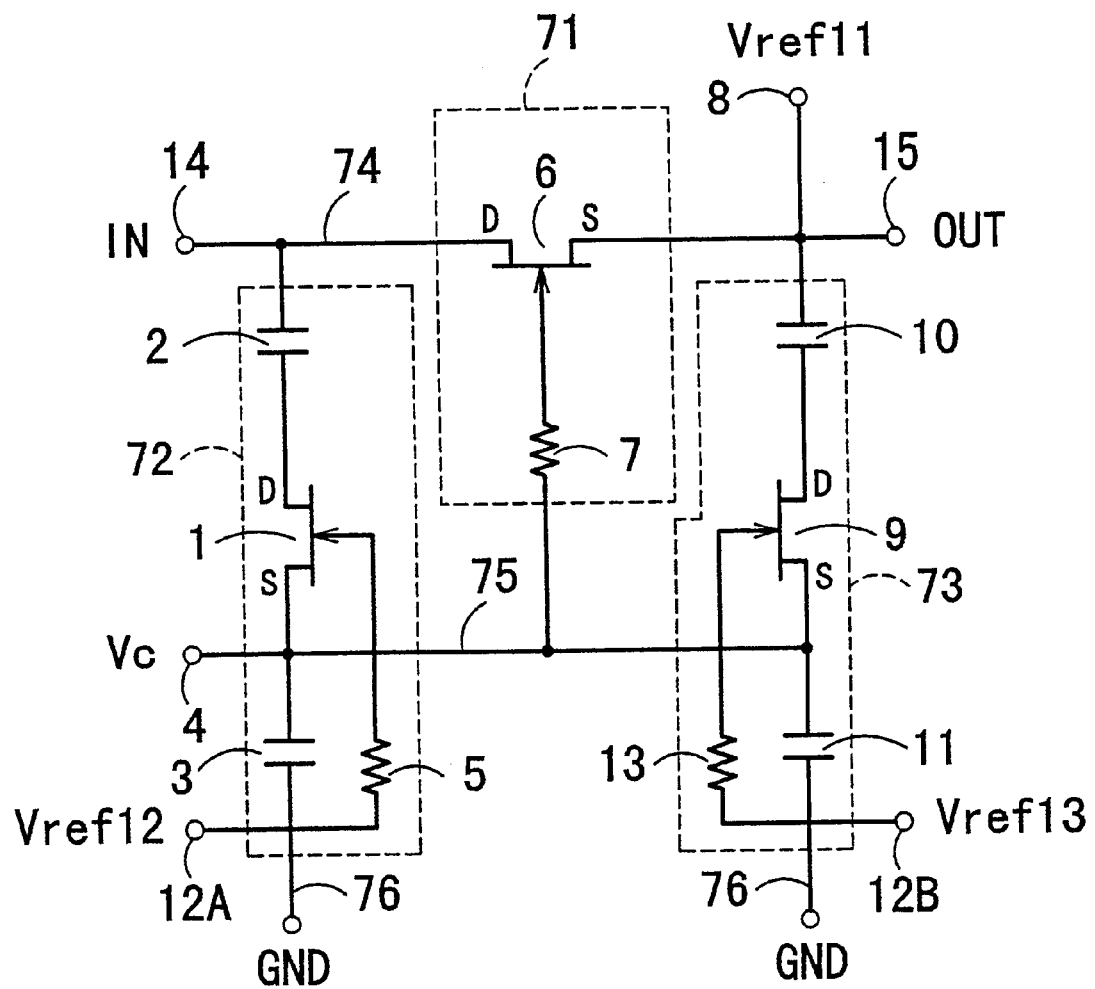
FIG. 2 is a block diagram showing the detailed configuration of the amplifier according to the first embodiment of the present invention.

FIG. 1 is a simplified block diagram showing the configuration of an amplifier (semiconductor integrated circuit device) according to the first embodiment of the present invention, and FIG. 2 is a circuit diagram showing the detailed configuration of the amplifier according to the first embodiment of the present invention. This amplifier is fabricated in integrated circuit form on a single semiconductor (GaAs) substrate, and is used to perform gain control in steplike manner in the high frequency section of a mobile communication terminal transmitter. The illustrated configuration can also be implemented as an integrated circuit on a silicon substrate; in that case, microcomputer logic circuits can be integrated on the same substrate.

The amplifier performs steplike gain control using a point where the gain changes largely; by using this amplifier in combination with an amplifier for performing continuous (linear) gain control in the intermediate frequency section, gain control over a wide range of 70 dB or greater is achieved.

As shown in FIGS. 1 and 2, the amplifier includes a signal line 74 containing a series variable resistor 71 connecting between an input terminal 14 as a signal input part and an output terminal 15 as a signal output part, and parallel variable resistors 72 and 73 are connected between a ground line 76 and the input terminal 14 and output terminal 15, respectively. The ground line 76 is connected to ground GND which is a base potential part. A gain control line 75 is connected to the variable resistors 71, 72, and 73. In this amplifier, reference voltage application terminals 8, 12A, and 12B as reference voltage application parts are connected to the variable resistors 71, 72, and 73, respectively, and reference voltages Vref11, Vref12, and Vref13 are applied to the respective reference voltage application terminals 8, 12A, and 12B. Further, a gain control voltage application terminal 4 as a gain control voltage application part is connected to each of the variable resistors 71, 72, and 73 via the gain control line 75. Here, the circuit may be configured so that a common reference voltage is applied to the parallel variable resistors 72 and 73. This also applies to other embodiments hereinafter described.

The variable resistors 71, 72, and 73 are constructed from field effect transistors 6, 1, and 9 whose gates are connected to resistors 7, 5, and 13, respectively. The drain of the field effect transistor 6 forming the series variable resistor 71 is connected to the input terminal 14, and the source is connected to the output terminal 15. On the other hand, the drain of the field effect transistor 1 forming the parallel variable resistor 72 at the input side is connected to the input terminal 14 via a capacitor 2, and the source is connected to the ground GND via a capacitor 3 and ground line 76. Likewise, the drain of the field effect transistor 9 forming the parallel variable resistor 73 at the output side is connected to the output terminal 15 via a capacitor 10, and the source is connected to the ground GND via a capacitor 11 and ground line 76.

Further, the gate of the field effect transistor 6 forming the variable resistor 71 is connected to the gain control voltage application terminal 4 via the resistor 7 and gain control line 75, the source of the field effect transistor 1 forming the variable resistor 72 is connected to the gain control voltage application terminal 4 via the gain control line 75, and the source of the field effect transistor 9 forming the variable resistor 73 is connected to the gain control voltage application terminal 4 via the gain control line 75.

The reference voltage Vref11 from the reference voltage application terminal 8 is applied to the source of the field effect transistor 6 forming the variable resistor 71, while the reference voltages Vref12 and Vref13 from the reference voltage application terminals 12A and 12B are applied, via the respective resistors 5 and 13, to the gates of the field effect transistors 1 and 9 forming the respective variable resistors 72 and 73.

Here, the capacitors 2, 3, 10, and 11 each act to prevent the application of a dc voltage, while the resistors 7, 5, and 13 act to block the penetration of high frequency signals.

To block the penetration of high frequency signals, an upper limit value and a lower limit value are set for the resistors 7, 5, and 13, for example, as described below. The lower limit value is 1 kΩ. The reason for this setting is that unless an isolation of 20 dB or greater is provided, high frequency signals may be allowed to penetrate, increasing losses, etc. and thus affecting the control characteristic; when the lower limit is set to the above value, an isolation of 20 dB or greater can be obtained.

The upper limit value is 100 kΩ. The reason for this setting is that when a gate leakage current of 1 µA, for example, flows in the field effect transistor, if the resistance value of the resistor connected to the gate of the field effect transistor is 100 kΩ, the voltage drop $V_{DROP}$ across the resistor is given by $$V_{DROP}=1\times10^{-6} \times 100 \times 10^3 = 0.1 \text{ (V)}$$

which means that if the resistance value exceeds 100 kΩ, displacement in the control voltage exceeds 0.1 V, which can cause a substantial influence on the control characteristic.

In this amplifier, the gain control is performed by adjusting the amount of attenuation, and its functional block intended as an amplifier for raising the gain is not shown in the figure. Therefore, as far as the circuit of FIG. 2 is concerned, the circuit functions as an attenuator. This also applies to other embodiments hereinafter described.

FIG. 3 shows characteristic diagrams illustrating how the gain control is accomplished in the amplifier of FIG. 2 when the threshold voltage Vth of each of the field effect transistors 6, 1, and 9 is −0.7 V, and when Vref11 is set to 1.8 V and Vref12 and Vref13 are both set to 1.0 V. FIG. 3(a) shows the gain control voltage Vc versus gain (amount of attenuation) characteristic of the field effect transistor (series FET) 6 forming the series variable resistor 71. FIG. 3(b) shows the gain control voltage Vc versus gain (amount of attenuation) characteristics of the field effect transistors (shunt FETs) 1 and 9 forming the parallel variable resistors 72 and 73; the solid line shows the characteristic of the two transistors combined, and the dashed line the characteristic of either alone. FIG. 3(c) shows the gain control voltage Vc versus gain (amount of attenuation) characteristic of the amplifier of FIG. 2, obtained by combining the characteristics of FIGS. 3(a) and 3(b).

When the threshold voltage Vth of each of the field effect transistors 6, 1, and 9 is −0.7 V, as stated above, for the field effect transistor 6 forming the series variable resistor 71 the gain (amount of attenuation) varies over a range of 15 dB with a slope of 50 dB/V in proportion to the applied gain control voltage Vc when the gain control voltage Vc is varied within the range of 1.1 V to 1.4 V, while for the field effect transistors 1 and 9 forming the parallel variable resistors 72 and 73, the gain (amount of attenuation) varies over a range of 14 dB with a slope of 46 dB/V in proportion to the applied gain control voltage Vc when the gain control voltage Vc is varied within the range of 1.4 V to 1.7 V; as a result, the gain control voltage section ΔV where no gain control is performed is reduced to 0 V. In this case, the gain control width is 15 dB for the series variable resistor 71 and 14 dB for the parallel variable resistors 72 and 73, achieving a combined gain control width of 29 dB.

Figure 4:
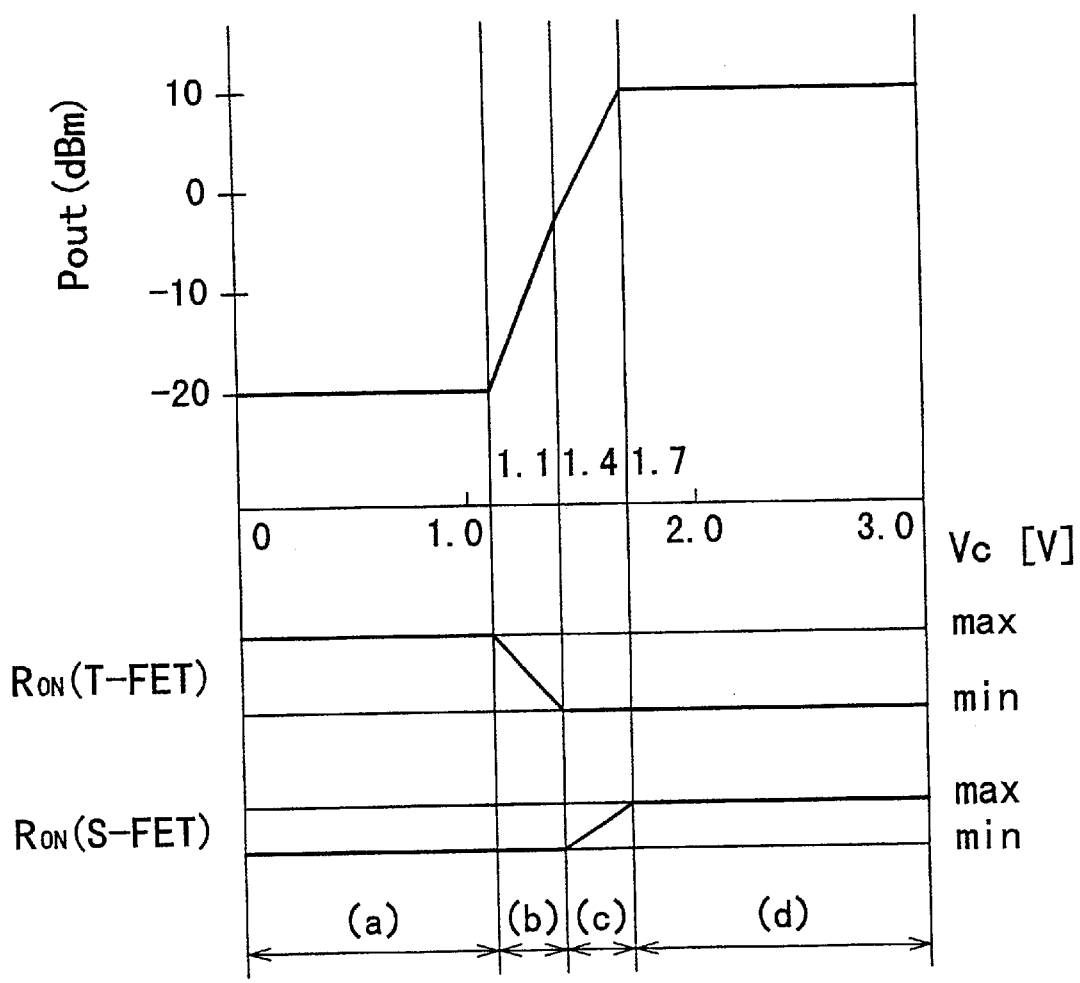
FIG. 4 is a diagram showing the gain control voltage versus gain control characteristic of the amplifier of FIG. 2.

FIG. 4 is a diagram showing the gain control voltage Vc versus gain control characteristic of the amplifier of the first embodiment, shown in FIG. 2, that performs gain control in the high frequency section of a mobile communication terminal transmitter.

The operation of the amplifier having the above-described configuration will be described below. The portable terminal is operated with a maximum voltage of about 3.0 V supplied from a lithium battery or the like. The threshold voltage of each field effect transistor refers to the bias required to cause the variable resistor to start its gain control operation, and the field effect transistors 6, 1, and 9 for the series variable resistor 71 and parallel variable resistors 72 and 73 are chosen to have the same threshold voltage. In this example, the threshold voltage is −0.7 V. The reference voltages Vref11, Vref12, and Vref13, described earlier, are applied to the reference voltage application terminal of the series variable resistor 17 and the reference voltage application terminals 12A and 12B of the parallel variable resistors 72 and 73, respectively.

Here, each variable resistor formed from a field effect transistor is completely off and exhibits the greatest resistance value when its gate to source voltage VGS drops below the threshold voltage Vth of the field effect transistor (VGS≦Vth). The gate to source voltage VGS of each field effect transistor is expressed by the difference between the gate voltage VG and source voltage VS (VG−VS), and the resistance value varies in accordance with the combination of the gain control voltage Vc and the reference voltage Vref11, Vref12, or Vref13, respectively. Accordingly, by varying the set values of the reference voltages Vref11, Vref12, and Vref13, it becomes possible to control the range of the gain control voltage Vc over which the gain can be controlled by the respective variable resistors.

In view of this, if the reference voltage Vref11 to the series variable resistor 71 and the reference voltages Vref12 and Vref13 to the parallel variable resistors 72 and 73 are set appropriately, the gain control voltage section ΔV where gain control cannot be performed, existing between the gain control operation range of the series variable resistor 72 and the gain control operation range of the parallel variable resistors 72 and 73, can be held to a value smaller than 0.15 V. In FIG. 3, the gain control range relative to the gain control voltage Vc is split between the series variable resistor 71 and the parallel variable resistors 72 and 73 so that the series variable resistor 71 is responsible for the gain control in the low voltage range and the parallel variable resistors 72 and 73 are responsible for the gain control in the high voltage range, but this relation may be reversed.

The reason will be described why the gain control voltage section ΔV of 0.15 V or greater is undesirable. Usually, step control consisting of five or so steps is used; in this case, since the gain is controlled in steps of 7 to 8 dB and the slope is about 50 dB/V, the control voltage is set in steps of 0.15 V. As a result, if the gain control voltage section ΔV where gain control cannot be performed is 0.15 V or greater, there occurs a point where the gain does not change if the control voltage is varied, and therefore, the gain cannot be controlled precisely.

The lower limit value of the gain control voltage section ΔV where gain control cannot be performed is 0 V. Basically, there will be no problem if the control characteristics overlap each other. However, since the slope becomes correspondingly steeper in the overlapped portion, the setting of the control voltage must be changed when performing the five-step control as described above.

Since the gain control voltage section ΔV where gain control cannot be performed has been held to a value smaller than 0.15 V, as described above, the gain control range of the series variable resistor 71 and the gain control range of the parallel variable resistors 72 and 73 can be concatenated in smoothly continuing fashion; this achieves highly precise gain control or makes the selection of the gain control voltage Vc easy when performing step control.

When a voltage of 0 to 1.1 V is applied to the gain control voltage application terminal 4 (the gain control voltage range (a) in FIG. 4), the resistance value $R_{ON}$ (T-FET) of the series variable resistor 71 is at its maximum level, while the resistance value $R_{ON}$ (S-FET) of each of the parallel variable resistors 72 and 73 is held at its minimum level; as a result, the signal input via the input terminal 14 is attenuated, with no increase in gain, and the magnitude of the output signal $P_{OUT}$ output from the output terminal is at its minimum level.

When a voltage greater than 1.1 V is applied to the gain control voltage application terminal 4 (the gain control voltage range (b) in FIG. 4), the resistance value $R_{ON}$ (T-FET) of the series variable resistor 71 begins to decrease, while the resistance value $R_{ON}$ (S-FET) of each of the parallel variable resistors 72 and 73 remains held at the minimum level; as a result, the magnitude of the output signal $P_{OUT}$ increases. Usually, the gain control voltage operation range where a variable resistor formed from a field effect transistor performs a linear gain control operation is about 0.2 to 0.3 V wide; therefore, the gain increases linearly by 15 dB until a voltage of 1.4 V is applied to the gain control voltage application terminal 4.

When the voltage of 1.4 V is applied to the gain control voltage application terminal 4 (the gain control voltage range (c) in FIG. 4), the resistance value $R_{ON}$ (T-FET) of the series variable resistor 71, which has been decreasing, now reaches its minimum level, while the resistance value $R_{ON}$ (S-FET) of each of the parallel variable resistors 72 and 73, which has been held at minimum, begins to increase; as a result, the magnitude of the output signal $P_{OUT}$ increases. The gain increases linearly by 14 (=2×7) dB with a sensitivity different from that in the gain control voltage range (b) of 1.1 to 1.4 V, until a voltage of 1.7 V is applied to the gain control voltage application terminal 4.

When the voltage of 1.7 V is applied to the gain control voltage application terminal 4 (the gain control voltage range (d) in FIG. 4), the resistance value $R_{ON}$ (S-FET) of each of the parallel variable resistors 72 and 73 reaches the maximum level, while the resistance value $R_{ON}$ (T-FET) of the series variable resistor 71 remains held at the minimum level; as a result, the magnitude of the output signal $P_{OUT}$ reaches maximum. At this point, the gain control width of this amplifier is 29 dB. If a voltage greater than 1.7 V is applied to the gain control voltage application terminal 4, the resistance value $R_{ON}$ (T-FET) of the series variable resistor 71 remains minimum and the resistance value $R_{ON}$ (S-FET) of each of the parallel variable resistors 72 and 73 remains maximum, so that the magnitude of the output signal $P_{OUT}$ remains maximum.

In the amplifier having the above characteristics, when performing step control, the gain control voltage Vc is varied in steps to vary the gain (amount of attenuation) incrementally by a predetermined amount, and gain control having good linearity (within ±1 dB) over a wide gain control range of 70 dB or greater, is accomplished by combining such step control with continuous gain control at intermediate frequency.

According to this embodiment, by applying the appropriate reference voltages Vref11, Vref12, and Vref13 to the series variable resistor 71 and parallel variable resistors 72 and 73, respectively, the gain control voltage section where gain control cannot be performed, existing between the linear gain control operation voltage ranges of the respective variable resistors 71, 72, and 73, can be made small or be eliminated, so that highly precise gain control can be achieved when controlling the gain in steplike manner.

In the above embodiment, single-gate transistors have been used for the field effect transistors forming the respective variable resistors 71, 72, and 73; here, if the transistors are chosen to have the same gate width Wg (hence, the same gate length), the gain control characteristic achieved by the variable resistor 71 can be made to match the gain control characteristic achieved by the two variable resistors 72 and 73, and the linearity of the combined characteristic can be further improved.

A second embodiment of the present invention will be described below with reference to drawings.

Figure 5:
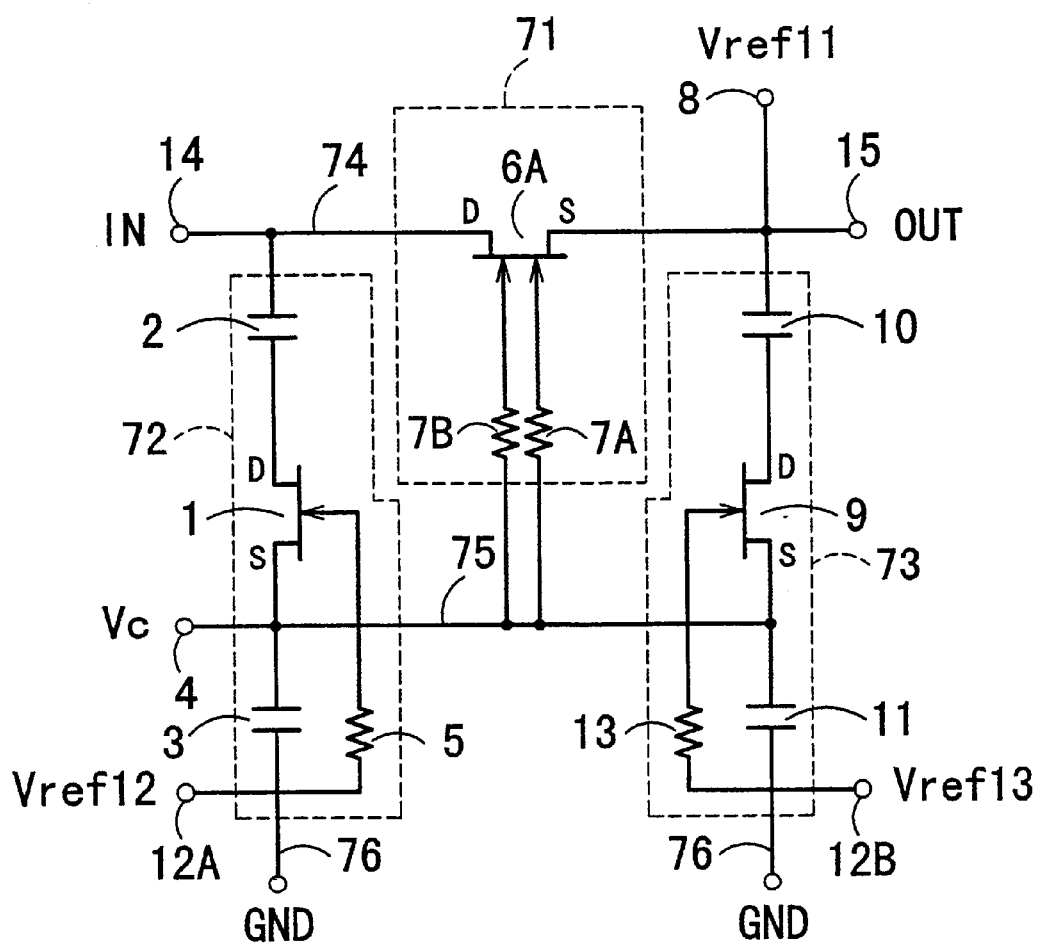
FIG. 5 is a block diagram showing the detailed configuration of an amplifier according to a second embodiment of the present invention.

FIG. 5 is a circuit diagram showing the detailed configuration of the amplifier according to the second embodiment of the present invention. In this amplifier, the single-gate field effect transistor 6 in FIG. 2 is replaced by a multi-gate (multiple control electrode) transistor which is, in the illustrated example, a dual-gate field effect transistor 6A whose gates are connected to the gain control voltage application terminal 4 via resistors 7A and 7B and via the gain control line 75; in other respects, the configuration is the same as that of the amplifier of FIG. 2.

Figure 6:
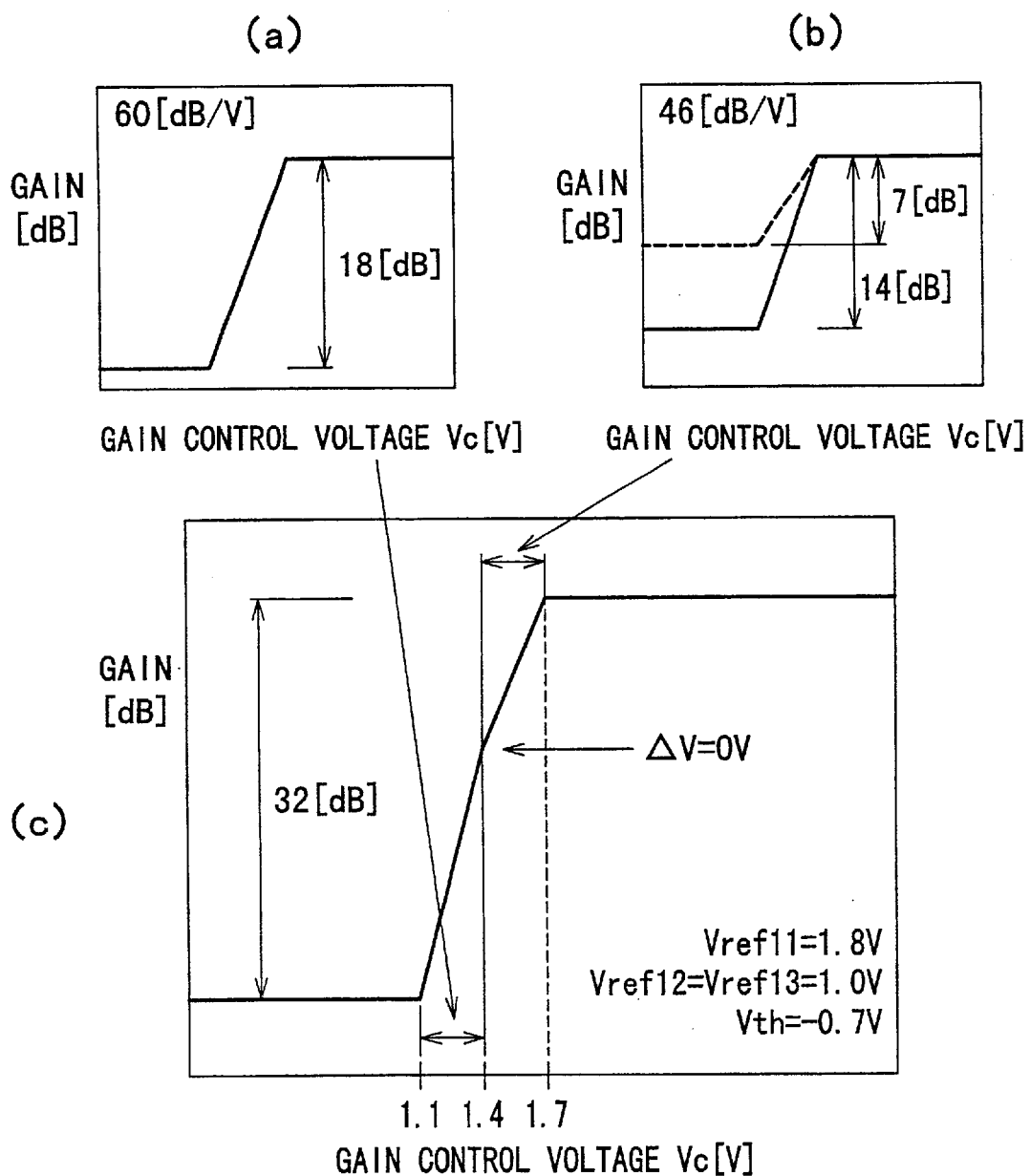
FIG. 6 is a diagram showing gain control characteristics for the amplifier of FIG. 2 when the threshold voltage Vth of each of the field effect transistors 6, 1, and 9 is −0.7 V, and when Vref11 is set to 1.8 V and Vref12 and Vref13 are both set to 1.0 V.

FIG. 6 shows characteristic diagrams illustrating how the gain control is accomplished in the amplifier of FIG. 5 when the threshold voltage Vth of each of the field effect transistors 6A, 1, and 9 is −0.7 V, and when Vref11 is set to 1.8 V and Vref12 and Vref13 are both set to 1.0 V. FIG. 6(a) shows the gain control voltage Vc versus gain (amount of attenuation) characteristic of the field effect transistor (series FET) 6A forming the series variable resistor 71. FIG. 6(b) shows the gain control voltage Vc versus gain (amount of attenuation) characteristics of the field effect transistors (shunt FETs) 1 and 9 forming the parallel variable resistors 72 and 73; the solid line shows the characteristic of the two transistors combined, and the dashed line the characteristic of either alone. FIG. 6(c) shows the gain control voltage Vc versus gain (amount of attenuation) characteristic of the amplifier of FIG. 5, obtained by combining the characteristics of FIGS. 6(a) and 6(b).

When the threshold voltage Vth of each of the field effect transistors 6A, 1, and 9 is −0.7 V, as stated above, for the field effect transistor 6A forming the series variable resistor 71 the gain (amount of attenuation) varies over a range of 18 dB with a slope of 60 dB/V in proportion to the applied gain control voltage Vc when the gain control voltage Vc is varied within the range of 1.1 V to 1.4 V, while for the field effect transistors 1 and 9 forming the parallel variable resistors 72 and 73, the gain (amount of attenuation) varies over a range of 14 dB with a slope of 46 dB/V in proportion to the applied gain control voltage Vc when the gain control voltage Vc is varied within the range of 1.4 V to 1.7 V; as a result, the gain control voltage section ΔV where no gain control is performed is reduced to 0 V. In this case, the gain control width is 18 dB for the series variable resistor 71 and 14 dB for the parallel variable resistors 72 and 73, achieving a combined gain control width of 32 dB.

According to this embodiment, since a dual-gate transistor is used for the field effect transistor 6A forming the variable resistor 71, the gain control width is increased by about 3 dB, and an improvement of about 3 dBc in distortion characteristic is achieved. As described above, by using a multi-gate field effect transistor as the field effect transistor 6A forming the variable resistor 71, increased gain control width and reduced distortion can be achieved. Other effects are the same as those achieved with the amplifier constructed using the single-gate field effect transistor 6.

A third embodiment of the present invention will be described below with reference to drawings.

Figure 7:
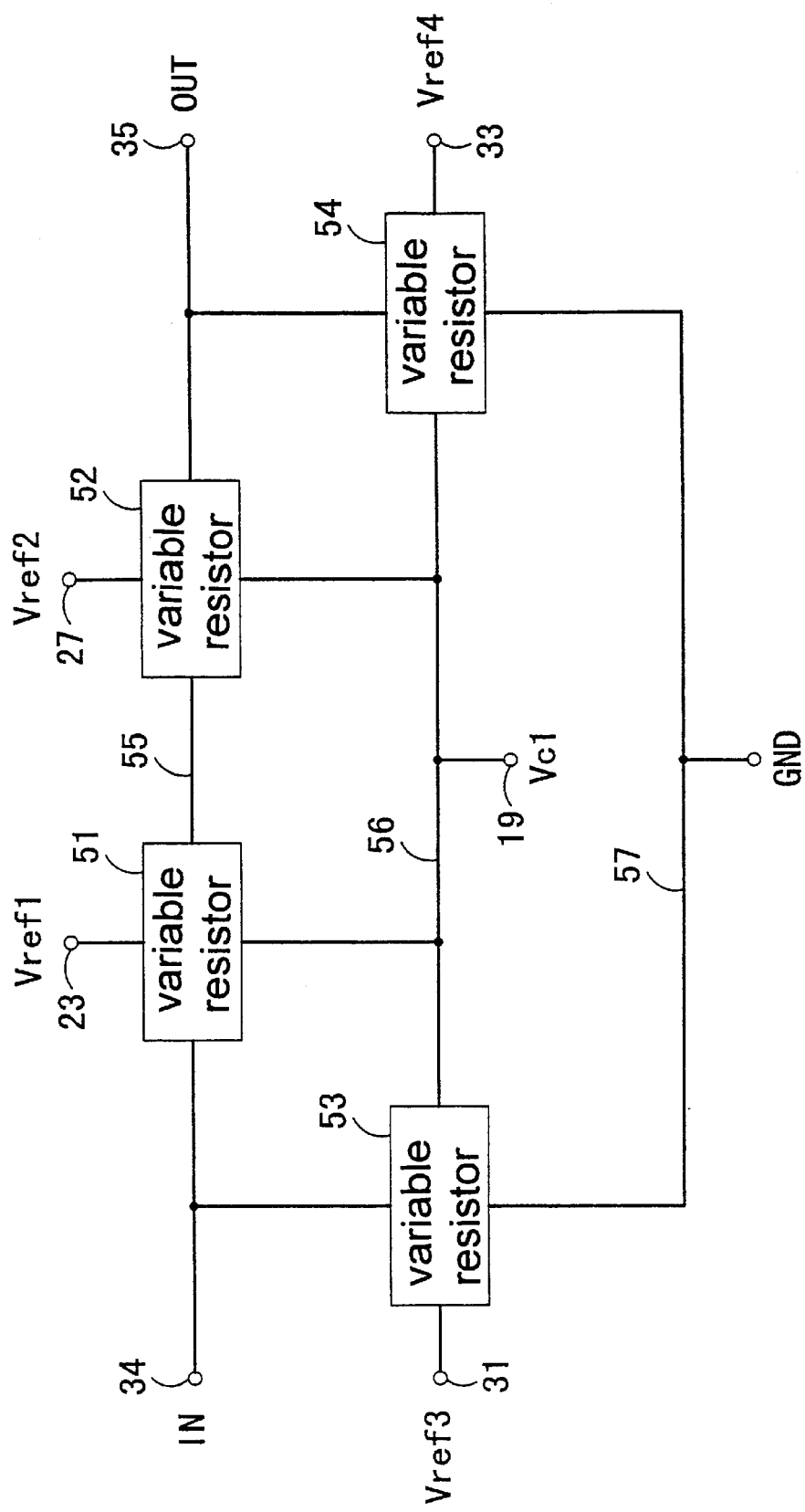
FIG. 7 is a block diagram showing the configuration of an amplifier according to a third embodiment of the present invention.
Figure 8:
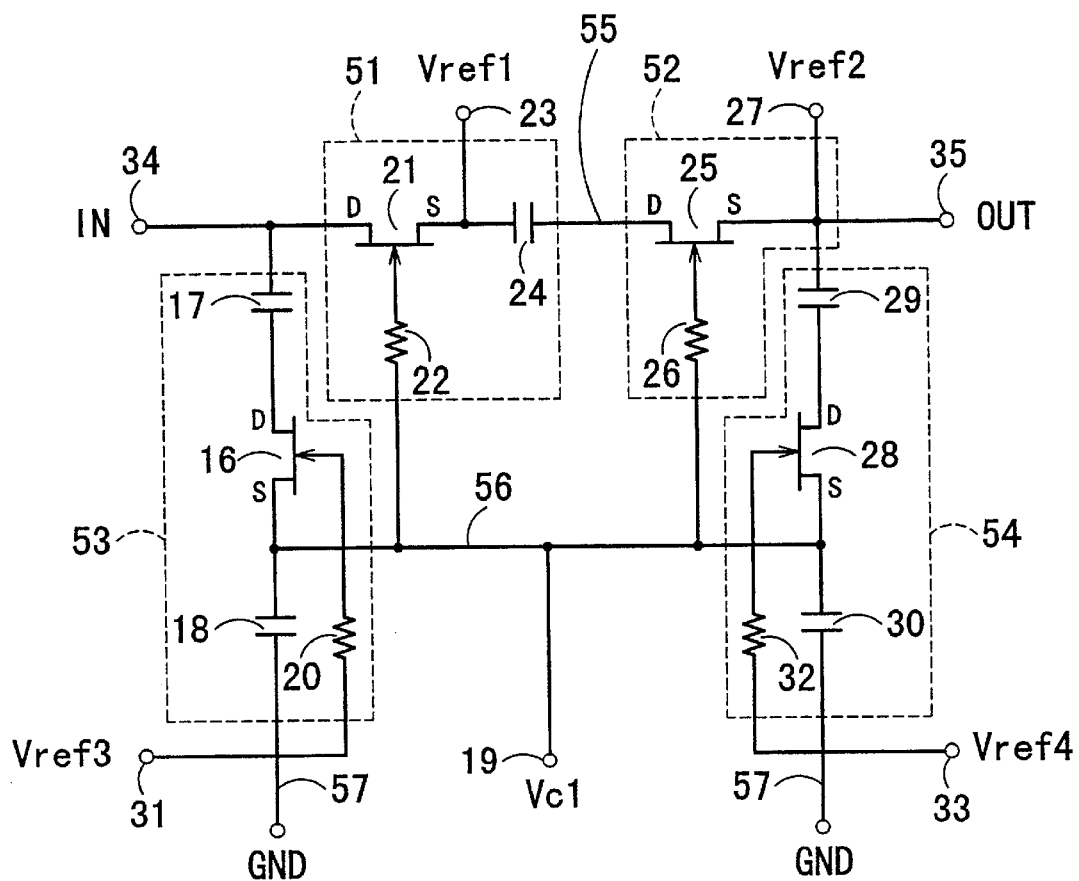
FIG. 8 is a circuit diagram showing the detailed configuration of the amplifier according to the third embodiment of the present invention wherein reference voltage application terminals 23 and 27 are provided so that different voltages can be applied to the source electrodes of field effect transistors 21 and 25 forming series variable resistors.

FIG. 7 is a simplified block diagram showing the configuration of the amplifier (semiconductor integrated circuit device) according to the third embodiment of the present invention, and FIG. 8 is a circuit diagram showing the detailed configuration of the amplifier according to the third embodiment of the present invention. This amplifier is fabricated in integrated circuit form on a single semiconductor (GaAs) substrate. The illustrated configuration can also be implemented as an integrated circuit on a silicon substrate; in that case, microcomputer logic circuits can be integrated on the same substrate.

With this amplifier, since continuous gain control is performed using regions where the gain varies linearly, gain control having excellent linearity over a wide range can be achieved, compared with the amplifier using a single series variable resistor. Therefore, gain control having excellent linearity over a wide range can be achieved with this amplifier alone, without having to combine it with the gain control performed by the amplifier in the intermediate frequency section. Also, by increasing the number of series variable resistors, it becomes possible to achieve gain control having excellent linearity over a wide range of 70 dB or greater.

As shown in FIGS. 7 and 8, the amplifier includes a signal line 55 containing at least two series variable resistors 51 and 52 connecting between an input terminal 34 as the signal input part and an output terminal 35 as the signal output part, and parallel variable resistors 53 and 54 are connected between a ground line 57 and the input terminal 34 and output terminal 35, respectively. The ground line 57 is connected to ground GND which is a base potential part. A gain control line 56 is connected to the variable resistors 51, 52, 53, and 54. In this amplifier, reference voltage application terminals 23, 27, 31, and 33 as the reference voltage application parts are connected to the variable resistors 51, 52, 53, and 54, respectively, and reference voltages Vref1, Vref2, Vref3, and Vref4 are applied to the respective reference voltage application terminals 23, 27, 31, and 33. Further, a gain control voltage application terminal 19 as the gain control voltage application part is connected to each of the variable resistors 51, 52, 53, and 54 via the gain control line 56. Here, the circuit maybe configured so that a common reference voltage is applied to the parallel variable resistors 53 and 54. This also applies to other embodiments hereinafter described.

The variable resistors 51, 52, 53, and 54 are constructed from field effect transistors 21, 25, 16, and 28 whose gates, at least, are connected to resistors 22, 26, 20, and 32, respectively. The drain of the field effect transistor 21 forming the series variable resistor 51 at the input side is connected to the input terminal 34, and the source is connected to one end of a capacitor 24. The drain of the field effect transistor 25 forming the series variable resistor 52 at the output side is connected to the other end of the capacitor 24, and the source is connected to the output terminal 35. On the other hand, the drain of the field effect transistor 16 forming the parallel variable resistor 53 at the input side is connected to the input terminal 34 via a capacitor 17, and the source is connected to the ground GND via a capacitor 18 and ground line 57. Likewise, the drain of the field effect transistor 28 forming the parallel variable resistor 54 at the output side is connected to the output terminal 35 via a capacitor 29, and the source is connected to the ground GND via a capacitor 30 and ground line 57.

Further, the gate of the field effect transistor 21 forming the variable resistor 51 is connected to the gain control voltage application terminal 19 via the resistor 22 and gain control line 56, the gate of the field effect transistor 25 forming the variable resistor 52 is connected to the gain control voltage application terminal 19 via the resistor 26 and gain control line 56, the source of the field effect transistor 16 forming the variable resistor 53 is connected to the gain control voltage application terminal 19 via the gain control line 56, and the source of the field effect transistor 28 forming the variable resistor 54 is connected to the gain control voltage application terminal 19 via the gain control line 56.

The reference voltages Vref1 Vref2 from the reference voltage application terminals 23 and 27 are applied to the sources of the field effect transistors 21 and 25 forming the respective variable resistors 51 and 52, while the reference voltages Vref3 and Vref4 from the reference voltage application terminals 31 and 33 are applied via the respective resistors 20 and 32 to the gates of the field effect transistors 16 and 28 forming the respective variable resistors 53 and 54.

Here, the capacitors 17, 18, 24, 29, and 30 each act to prevent the application of a dc voltage, while the resistors 20, 22, 26, and 32 act to block the penetration of high frequency signals.

To block the penetration of high frequency signals, an upper limit value and a lower limit value are set for the resistors 20, 22, 26, and 32, for example, as described below. The lower limit value is 1 kΩ. The reason for this setting is that unless an isolation of 20 dB or greater is provided, high frequency signals may be allowed to penetrate, increasing losses, etc. and thus affecting the control characteristic; when the lower limit is set to the above value, an isolation of 20 dB or greater can be obtained.

The upper limit value is 100 kΩ. The reason for this setting is that when a gate leakage current of 1 μA, for example, flows in the field effect transistor, if the resistance value of the resistor connected to the gate of the field effect transistor is 100 kΩ, the voltage drop $V_{DROP}$ across the resistor is given by $$V_{DROP} = 1 \times 10^{-6} \times 100 \times 10^{3} = 0.1 \text{ (V)}$$

which means that if the resistance value exceeds 100 kΩ, displacement in the control voltage exceeds 0.1 V, which can cause a substantial influence on the control characteristic.

In this amplifier, the gain control is performed by adjusting the amount of attenuation, and its functional block intended as an amplifier for raising the gain is not shown in the figure. Therefore, as far as the circuit of FIG. 8 is concerned, the circuit functions as an attenuator. This also applies to other embodiments hereinafter described.

Figure 9:
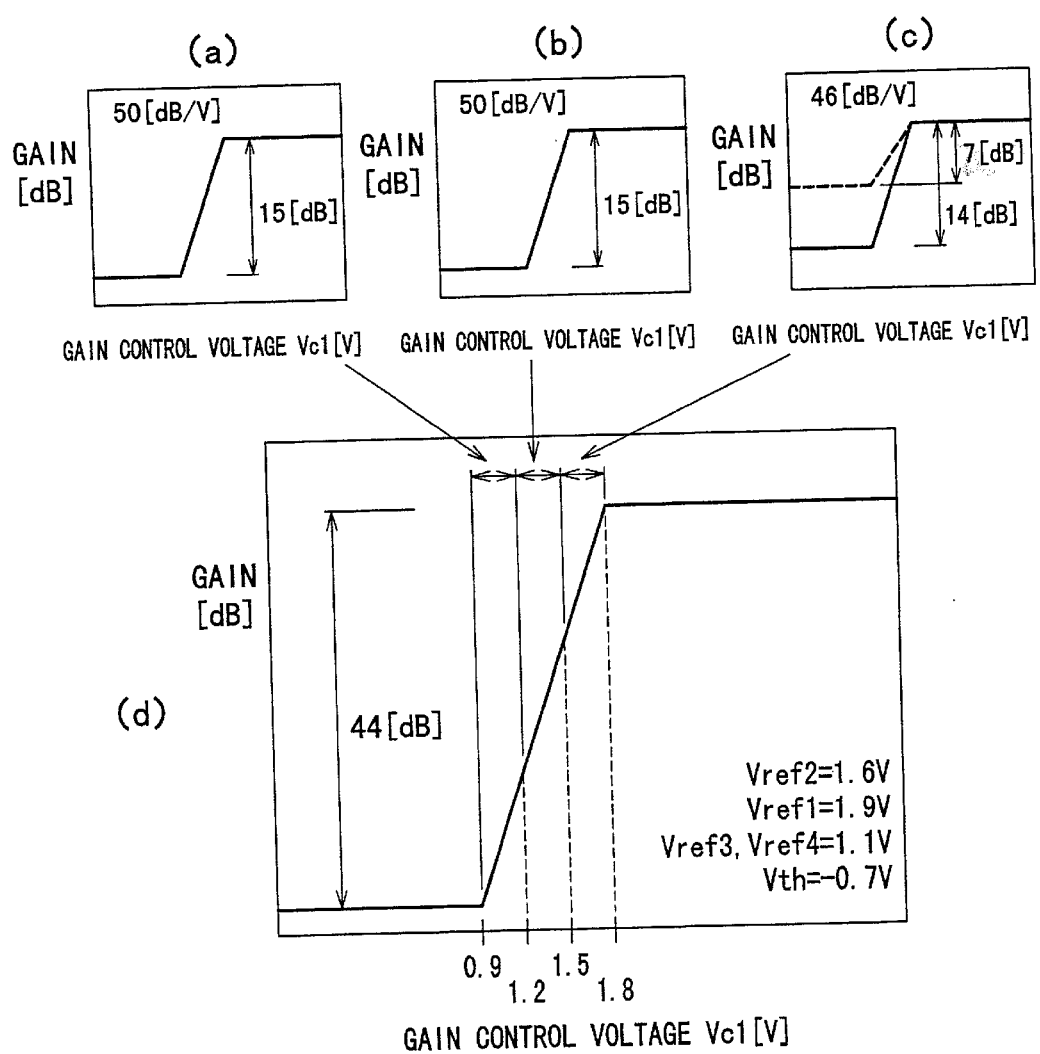
FIG. 9 is a diagram showing gain control characteristics for the amplifier of FIG. 8 when the threshold voltage Vth of each of the field effect transistors 21, 25, 16, and 28 is −0.7 V, and when Vref1 is set to 1.9 V, Vref2 is set to 1.6 V, and Vref3 and Vref4 are both set to 1.1 V.

FIG. 9 shows characteristic diagrams illustrating how the gain control is accomplished in the amplifier of FIG. 8 when the threshold voltage Vth of each of the field effect transistors 21, 25, 16, and 28 is −0.7 V, and when Vref1 is set to 1.9 V, Vref2 is set to 1.6 V, and Vref3 and Vref4 are both set to 1.1 V. FIG. 9(*a*) shows the gain control voltage Vc1 versus gain (amount of attenuation) characteristic of the field effect transistor (series FET) 25 forming the series variable resistor 52. FIG. 9(*b*) shows the gain control voltage Vc1 versus gain (amount of attenuation) characteristic of the field effect transistor (series FET) 21 forming the series variable resistor 51. FIG. 9(*c*) shows the gain control voltage Vc1 versus gain (amount of attenuation) characteristics of the field effect transistors (shunt FETs) 16 and 28 forming the parallel variable resistors 53 and 54; the solid line shows the characteristic of the two transistors combined, and the dashed line the characteristic of either alone. FIG. 9(*d*) shows the gain control voltage Vc1 versus gain (amount of attenuation) characteristic of the amplifier of FIG. 8, obtained by combining the characteristics of FIGS. 9(*a*), 9(*b*), and 9(*c*).

When the threshold voltage Vth of each of the field effect transistors 21, 25, 16, and 28 is −0.7 V, as stated above, for the field effect transistor 25 forming the series variable resistor 52 the gain (amount of attenuation) varies over a range of 15 dB with a slope of 50 dB/V in proportion to the applied gain control voltage Vc1 when the gain control voltage Vc1 is varied within the range of 0.9 V to 1.2 V, and for the field effect transistor 21 forming the series variable resistor 51, the gain (amount of attenuation) varies over a range of 15 dB with a slope of 50 dB/V in proportion to the applied gain control voltage Vc1 when the gain control voltage Vc1 is varied within the range of 1.2 V to 1.5 V, while for the field effect transistors 16 and 28 forming the parallel variable resistors 53 and 54, the gain (amount of attenuation) varies over a range of 14 dB with a slope of 46 dB/V in proportion to the applied gain control voltage Vc1 when the gain control voltage Vc1 is varied within the range of 1.5 V to 1.8 V; as can be seen, the gain control voltage section where no gain control is performed is substantially eliminated. In this case, the gain control width is 15 dB for the series variable resistor 51, 15 dB for the series variable resistor 52, and 14 dB for the parallel variable resistors 53 and 54, achieving a combined gain control width of 44 dB; in this way, a gain control characteristic with a wider variable width is obtained compared with the case where the number of series variable resistors is one, and by increasing the number of series variable resistors, it becomes possible to achieve gain control over a range of 70 dB or greater.

Figure 10:
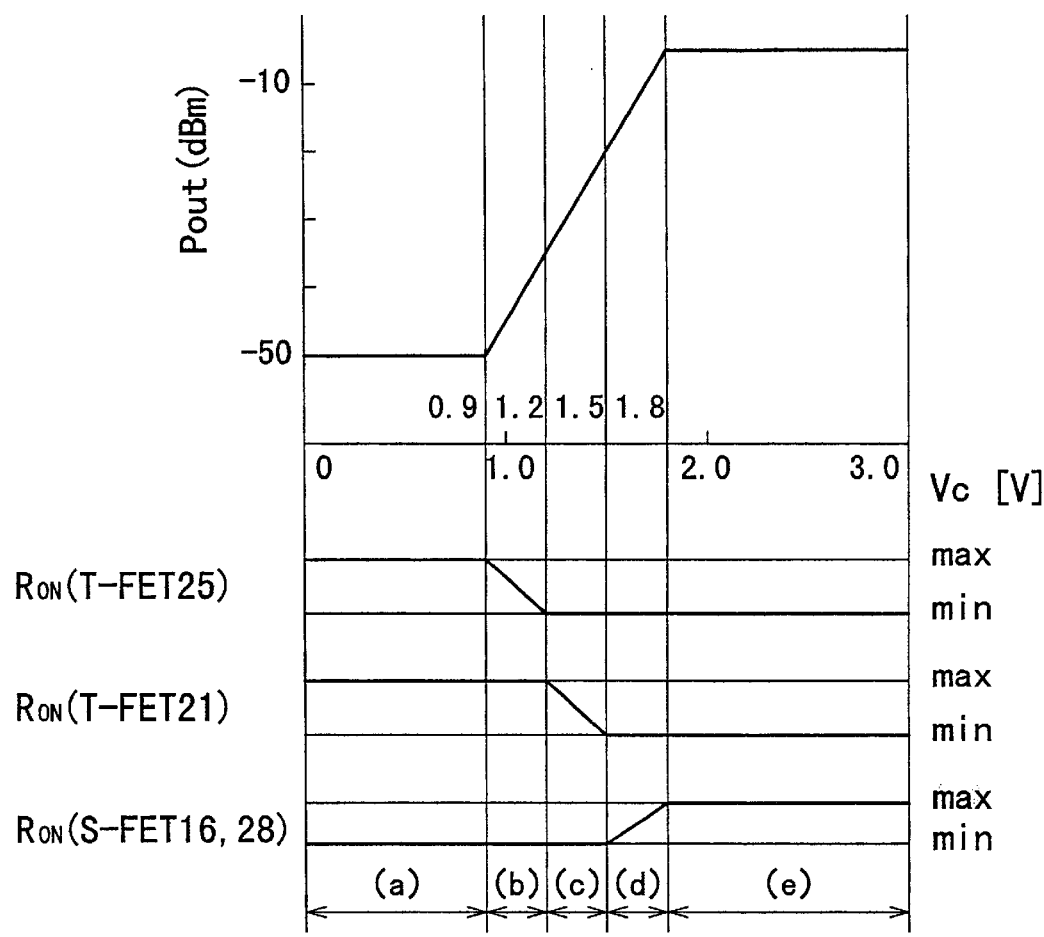
FIG. 10 is a diagram showing the gain control voltage versus gain control characteristic in the third embodiment of the present invention.

FIG. 10 is a diagram showing the gain control voltage Vc1 versus gain control characteristic of the amplifier of the third embodiment, shown in FIG. 8, that performs gain control in the high frequency section of a mobile communication terminal transmitter.

The operation of the amplifier having the above-described configuration will be described below. The portable terminal is operated with a maximum voltage of about 3.0 V supplied from a lithium battery or the like. The threshold voltage of each field effect transistor refers to the bias required to cause the variable resistor to start its gain control operation, and the field effect transistors for the series variable resistors 51 and 52 and parallel variable resistors 53 and 54 are chosen to have the same threshold voltage. In this example, the threshold voltage is −0.7 V.

The reference voltages Vref1 and Vref2 of different values are applied to the respective reference voltage application terminals 23 and 27 of the series variable resistors 51 and 52, while the reference voltages Vref3 and Vref4 of the same value are applied to the respective reference voltage application terminals 31 and 33 of the parallel variable resistors 53 and 54. The reference voltages Vref1 and Vref2 applied to the reference voltage application terminals 23 and 27 of the series variable resistors 51 and 52 are set so that the reference voltage Vref1 applied to the reference voltage application terminal 23 at the input side is higher than the reference voltage Vref2 applied to the reference voltage application terminal 27 at the output side by a value equivalent to the width of a linear gain control operation voltage range (0.2 to 0.3 V).

The reference voltages Vref1, Vref2, Vref3, and Vref4 should be set so that the linear gain control operation ranges of the series variable resistors 51, 52 and parallel variable resistors 53, 54 can be regarded as being substantially continuous. This also applies to other embodiments hereinafter described.

Here, each variable resistor formed from a field effect transistor is completely off and exhibits the greatest resistance value when its gate to source voltage VGS drops below the threshold voltage Vth of the field effect transistor (VGS≦Vth). The gate to source voltage VGS of each field effect transistor is expressed by the difference between the gate voltage VG and source voltage VS (VG−VS), and the resistance value varies in accordance with the combination of the gain control voltage Vc1 and the reference voltage Vref1, Vref2, Vref3, or Vref4 respectively. Accordingly, by varying the set values of the reference voltages Vref1, Vref2, Vref3, and Vref4, it becomes possible to control the range of the gain control voltage Vc1 over which the gain can be controlled by the respective variable resistors.

In view of this, if the reference voltages Vref1 and Vref2 to the series variable resistors 51 and 52 and the reference voltages Vref3 and Vref4 to the parallel variable resistors 53 and 54 are set appropriately, the gain control voltage section ΔV where gain control cannot be performed, existing between the gain control operation ranges of the respective series variable resistors 51 and 52 and the gain control operation range of the parallel variable resistors 53 and 54, can be held to a value smaller than 0.15 V. In FIG. 9, the gain control range relative to the gain control voltage Vc1 is split between the series variable resistors 51 and 52 and the parallel variable resistors 53 and 54 so that the series variable resistor 52 is responsible for the gain control in the low voltage range, the series variable resistor 51 is responsible for the gain control in the middle voltage range, and the parallel variable resistors 53 and 54 are responsible for the gain control in the high voltage range, but the order may be reversed and can be set as appropriate.

The reason will be described why the gain control voltage section ΔV of 0.15 V or greater is undesirable. Usually, step control consisting of five or so steps is used; in this case, since the gain is controlled in steps of 7 to 8 dB and the slope is about 50 dB/V, the control voltage is set in steps of 0.15 V. As a result, if the gain control voltage section ΔV where gain control cannot be performed is 0.15 V or greater, there occurs a point where the gain does not change if the control voltage is varied, and therefore, the gain cannot be controlled precisely.

The lower limit value of the gain control voltage section ΔV where gain control cannot be performed is 0 V. Basically, there will be no problem if the control characteristics overlap each other. However, since the slope becomes correspondingly steeper in the overlapped portion, the setting of the control voltage must be changed when performing the five-step control as described above.

As described above, in performing continuous gain control, by appropriately setting the reference voltages Vref1 and Vref2 and Vref3 and Vref4 applied to the series variable resistors 51 and 52 and parallel variable resistors 53 and 54, respectively, the gain control operation ranges of the series variable resistors 51 and 52 and parallel variable resistors 53 and 54 can be concatenated in smoothly continuing fashion, and gain control having excellent linearity can thus be performed over a wide range using a single gain control voltage. Accordingly, gain control having excellent linearity with a flatness of ±1 dB over a range of 70 dB or greater can be performed using a single semiconductor device in the high frequency section of a portable terminal. In this way, the precision of the gain control can be easily enhanced, while simplifying the circuit configuration and achieving a space saving design.

If it is assumed that the threshold voltage Vth of every field transistor is −0.7 V, then the reference voltage Vref1 is set to 1.9 V, the reference voltage Vref2 is set to 1.6 V, and the reference voltages Vref3 and Vref4 are both set to 1.1 V.

When a voltage of 0 to 0.9 V is applied to the gain control voltage application terminal 19 (the gain control voltage range (a) in FIG. 10), the resistance values $R_{ON}$ (T-FET21) and $R_{ON}$ (T-FET25) of the series variable resistors 51 and 52 are at their maximum levels, while the resistance value $R_{ON}$ (S-FET16, 28) of each of the parallel variable resistors 53 and 54 is held at its minimum level; as a result, the signal input from the input terminal 34 is attenuated, with no increase in gain, and the magnitude of the output signal $P_{OUT}$ at the output terminal 35 is at its minimum level.

When a voltage greater than 0.9 V is applied to the gain control voltage application terminal 19 (the gain control voltage range (b) in FIG. 10), the resistance value $R_{ON}$ (T-FET25) of the series variable resistor 52 at the output side begins to decrease, while the resistance value $R_{ON}$ (S-FET16, 28) of each of the parallel variable resistors 53 and 54 remains held at the minimum level and the resistance value $R_{ON}$ (T-FET21) of the series variable resistor 51 at the input side remains held at the maximum level; as a result, the magnitude of the output signal $P_{OUT}$ increases. Usually, the gain control voltage operation range where a variable resistor formed from a field effect transistor performs a linear gain control operation is about 0.2 to 0.3 V wide; therefore, the gain increases linearly by 15 dB until a voltage of 1.2 V is applied to the gain control voltage application terminal 19.

When the voltage of 1.2 V is applied to the gain control voltage application terminal 19 (the gain control voltage range (c) in FIG. 10), the resistance value $R_{ON}$ (T-FET25) of the series variable resistor 52 at the output side, which has been decreasing, now reaches its minimum level, while the resistance value $R_{ON}$ (T-FET21) of the series variable resistor 51 at the input side, which has been held at maximum, begins to decrease, so that the magnitude of the output signal $P_{OUT}$ continues to increase with the same sensitivity. At this time, the resistance value $R_{ON}$ (S-FET16, 28) of each of the parallel variable resistors 53 and 54 remains held at the minimum level.

When a voltage of 1.5 V is applied to the gain control voltage application terminal 19 (the gain control voltage range (d) in FIG. 10), the resistance value $R_{ON}$ (T-FET21) of the series variable resistor 51 at the input side, which has been decreasing, is now at its minimum level, as is the resistance value $R_{ON}$ (T-FET25) of the series variable resistor 52 at the output side, while on the other hand, the resistance value $R_{ON}$ (S-FET16, 28) of each of the parallel variable resistors 53 and 54, which has been held at the minimum level, beings to increase, so that the magnitude of the output signal $P_{OUT}$ increases linearly by 14 dB, this time with a sensitivity different from that in the voltage range of 0.9 to 1.5 V.

When a voltage of 1.8 V is applied to the gain control voltage application terminal 19 (the gain control voltage range (e) in FIG. 10), the resistance value $R_{ON}$ (S-FET16, 28) of each of the parallel variable resistors 53 and 54 is now at the maximum level, while the resistance values $R_{ON}$ (T-FET21) and $R_{ON}$ (T-FET25) of the series variable resistors 51 and 52 remain held at the minimum level; as a result, the magnitude of the output signal POuT reaches maximum. At this point, the gain control width of this amplifier is 44 dB. If a voltage greater than 1.8 V is applied to the gain control voltage application terminal 19, the resistance values $R_{ON}$ (T-FET21) and $R_{ON}$ (T-FET25) of the series variable resistors 51 and 52 remain minimum and the resistance value $R_{ON}$ (S-FET16, 28) of the parallel variable resistors 53 and 54 remains maximum, so that the magnitude of the output signal $P_{OUT}$ remains maximum.

As described above, according to this embodiment, the series variable resistors 51 and 52, each implemented by a field effect transistor, are connected in a multiple stage configuration with the capacitor 24 interposed therebetween, and the operation points of the series variable resistors 51 and 52 are shifted between them by an amount equivalent to the width of the linear gain control operation range, so that the linear operation ranges of the series variable resistors 51 and 62 can be concatenated to provide a wide linear range over which the gain control amount can be changed linearly with the control voltage. Shifting the operation points of the series variable resistors 51 and 52 by an amount equivalent to the width of the linear gain control operation range can be accomplished by adjusting the respective reference voltages using an external microcomputer.

In a CDMA system, since each signal is assigned a unique code, and every transmitted signal is handled in the same time and frequency domains, the distortion characteristics of devices become an extremely important factor. Particularly, when operating the series variable resistors 51 and 52, each implemented by a field effect transistor, in such a manner that one is shifted from the other by an amount equivalent to the width of the linear gain control operation range, as in the above embodiment, the series variable resistor 52 at the output side is put into operation in advance of the operation of the series variable resistor 51 at the input side in response to the gain control voltage Vc1; since this serves to spread out the degradation points of the distortion characteristics of the input side series variable resistor 51, the output side series variable resistor 52, and the parallel variable resistors 53 and 54, eliminating the superimposition of degraded distortion power, degradation of the distortion characteristics can be prevented in combination with the operation of the parallel variable resistors 53 and 54. As shown in FIG. 11, the distortion characteristic improves by about 4 dBc in terms of adjacent channel leakage power at 900 kHz detuning (ACP 900 kHz), compared with the case where the series variable resistors 51 and 52 are operated simultaneously in a similar configuration.

In the above embodiment, in the shifted operation of the series variable resistors 51 and 52 effected by the respective field effect transistors, the output side series variable resistor 52 is operated in advance of the operation of the input side series variable resistor 51 in response to the gain control voltage Vc1, but it will be appreciated that similar characteristics can be obtained if the input side series variable resistor 51 is operated first. This provides greater freedom in setting the control voltage by microcomputer logics.

Furthermore, in the above embodiment, the reference voltage application terminals 23 and 27 are provided for the input side series variable resistor 51 and the output side series variable resistor 52, respectively, and the reference voltage application terminals 31 and 33 are provided for the parallel variable resistors 53 and 54, respectively, but instead, the reference voltages may be applied through bias resistors 38, 39, and 40, as shown in FIG. 12. In this case, the circuit configuration can be simplified since only one reference voltage application terminal is used. The bias resistors 38, 39, and 40 each act to block the penetration of high frequency signals. Each of the bias resistors 38, 39, and 40 is chosen to have a resistance value not smaller than about 5 kΩ and not larger than 100 kΩ in order to block the penetration of high frequency signals.

The reason why each of the bias resistors 38, 39, and 40 should be chosen to have a resistance value not smaller than about 5 kΩ and not larger than 100 kΩ will be described below.

First, the reason for setting the lower limit value at 5 kΩ is as follows. The bias resistor 38 and the field effect transistor 25 are connected in parallel, and the gain is controlled by varying the resistance of the field effect transistor 25. Now, suppose that the resistance value of the bias resistor 38 is smaller than 5 kΩ; in that case, even if the resistance of the field effect transistor 25 is increased, the resistance across the parallel circuit of the bias resistor 38 and field effect transistor 25 cannot be made larger than about 5 kΩ, as a result of which the gain control width decreases and the gain cannot be controlled with high precision. That is, penetration of high frequency signals cannot be prevented. Also, if the resistance values of the bias resistors 39 and 40 are small, high frequency signals would pass to ground; therefore, a resistance of 5 kΩ or larger (isolation of 40 dB or larger) is needed. Further, when the reference voltage Vref1 is 3 V, the current flowing through the bias resistors 38, 39, and 40 is $$I = 3\ V/15\ k\Omega = 200\ \mu A$$

or larger, increasing power consumption.

Next, the reason for setting the upper limit value at 100 kΩ is as follows. When the reference voltage Vref1 is 3 V, the current flowing through the bias resistors 38, 39, and 40 is $$I = 3\ V/300\ k\Omega = 10\ \mu A$$

Now, the voltage across the bias resistor 38 is $$V = 10\ \mu A \times 100\ k\Omega = 1\ V$$

At this time, if a leakage current of 1 μA flowed through the field effect transistor, a bias variation of 1 μA×100 kΩ=0.1 V occurs; as a result, the gain control characteristic is shifted and precise gain control cannot be performed.

Figure 13:
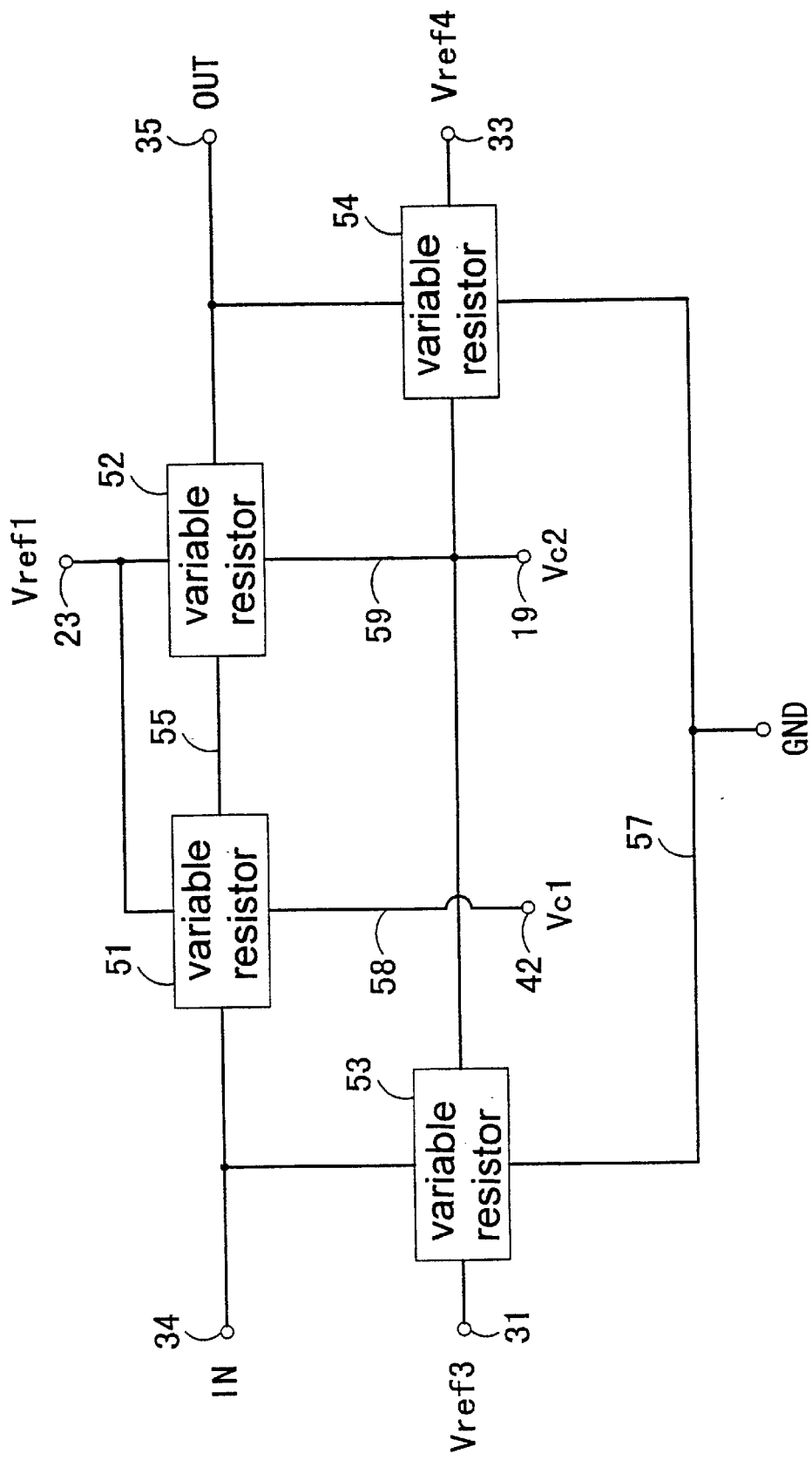
FIG. 13 is a block diagram showing the configuration of an amplifier according to a fourth embodiment of the present invention.
Figure 14:
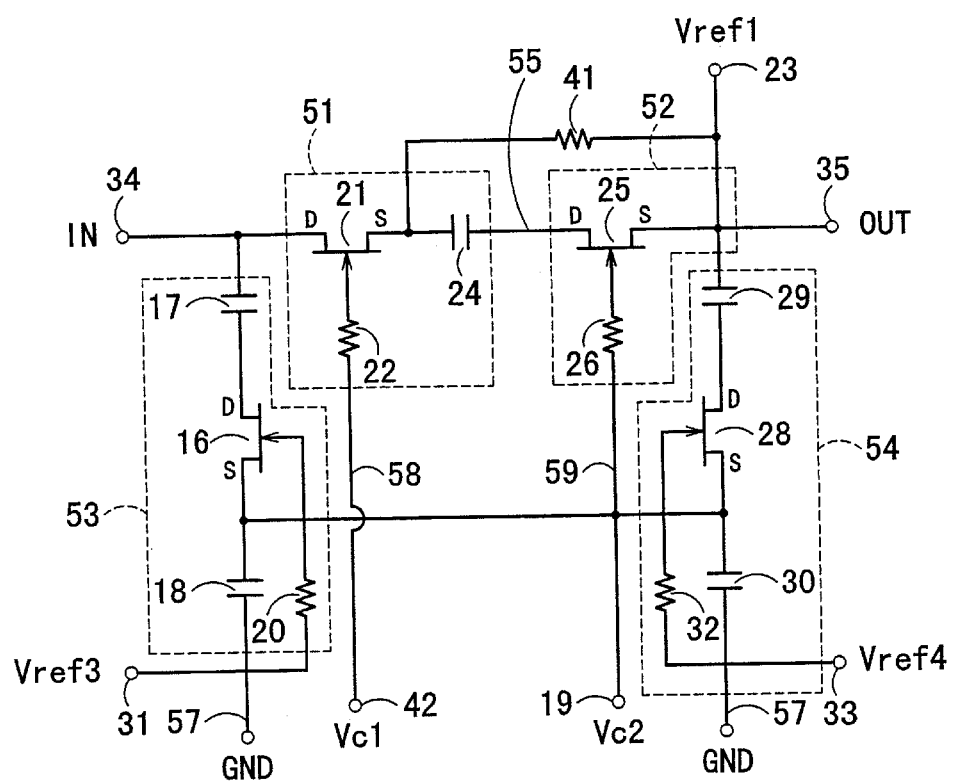
FIG. 14 is a circuit diagram showing the detailed configuration of the amplifier according to the fourth embodiment of the present invention wherein gain control voltage application terminals 42 and 19 are provided so that different voltages can be applied to the gates of the field effect transistors 21 and 25 forming the respective series variable resistors.

Further, in the above third embodiment, the reference voltage application terminals 23 and 27 are provided so that different voltages can be applied to the source electrodes of the field effect transistors acting as the series variable resistors 51 and 52, respectively, but instead, as shown in FIGS. 13 and 14 (fourth embodiment), gain control voltage application parts 42 and 19 may be provided for the series variable resistors 51 and 52 so that gain control voltages Vc1 and Vc2, one differing from the other by a value equivalent to the width of the linear gain control operation range, can be applied to the gates of the respective field effect transistors. In FIG. 13, reference numeral 58 indicates the first gain control line, and 59 the second gain control line.

In this configuration, the gain control voltage Vc1 applied to the gain control voltage application part 42 need only be set higher than the gain control voltage Vc2 applied to the gain control voltage application part 19 by a value equivalent to the width of the linear gain control operation range, and this eliminates the need for complicated voltage setting as required in the prior art configuration that uses a plurality of different gain control devices. Furthermore, since the same reference voltage Vref1 is applied to the source electrodes of the field effect transistors 21 and 25 acting as the series variable resistors 51 and 52, precise linear gain control can be achieved even when there occurs a fluctuation in the reference voltage Vref1. A resistor 41, inserted between the reference voltage application terminal 23 and the source electrodes of the field effect transistors 21 and 25 forming the series variable resistors 51 and 52, acts to block high frequency signals, and is chosen to have a resistance value not smaller than about 5 kΩ and not larger than 100 kΩ.

The reason why the resistor 41 should be chosen to have a resistance value not smaller than about 5 kΩ and not larger than 100 kΩ will be described below.

First, the reason for setting the lower limit value at 5 kΩ is as follows. The resistor 41 and the field effect transistor 25 are connected in parallel, and the gain is controlled by varying the resistance of the field effect transistor 25. Now, suppose that the resistance value of the resistor 41 is smaller than 5 kΩ; in that case, even if the resistance of the field effect transistor 25 is increased, the resistance across the parallel circuit of the resistor 41 and field effect transistor 25 cannot be made larger than about 5 kΩ, as a result of which the gain control width decreases and the gain cannot be controlled with high precision. That is, penetration of high frequency signals cannot be prevented.

Next, the reason for setting the upper limit value at 100 kΩ is as follows. If a leakage current (about 1 μA) flows through the field effect transistor, the potential difference across the resistor 41 would exceed $$V = 1\ \mu A \times 100\ k\Omega = 0.1\ V$$

thus resulting in a bias variation and rendering precise gain control impossible.

Likewise, as shown in FIG. 15, bias resistors 36 and 37 may be provided so that voltages, one differing from the other by a value equivalent to the width of the linear gain control operation range, can be applied to the gates of the respective field effect transistors 21 and 25 acting as the series variable resistors 51 and 52. In this case, microcomputer logic setting can be simplified since only one gain control voltage Vc1 is used; furthermore, since the same reference voltage is applied to the source electrodes of the field effect transistors 21 and 25 acting as the series variable resistors 51 and 52, precise linear gain control can be achieved even when there occurs a fluctuation in the reference voltage. For the reference voltage also, the voltage may be applied through bias resistors 41, 39, and 40. In this case, the circuit configuration can be simplified since only one reference voltage application terminal needs to be provided. The bias resistors 41, 39, and 40 act to prevent the penetration of high frequency signals. Each of the bias resistors 41, 39, and 40 is chosen to have a resistance value not smaller than about 5 kΩ and not larger than 100 kΩ in order to block the penetration of high frequency signals. The reason for setting the resistance value within this range is the same as that described with reference to FIG. 12.

Figure 16:
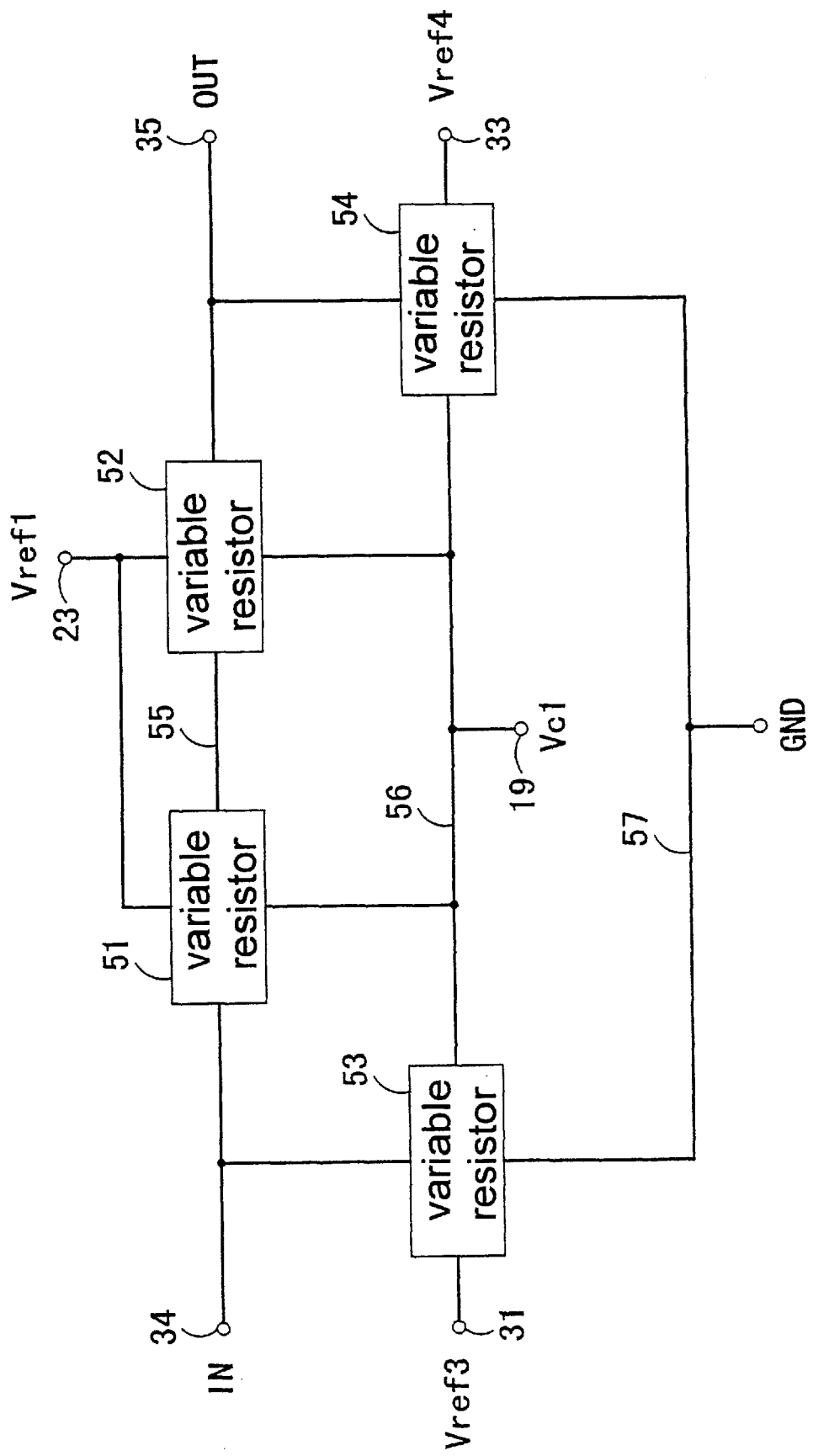
FIG. 16 is a block diagram showing the configuration of an amplifier according to a fifth embodiment of the present invention.
Figure 17:
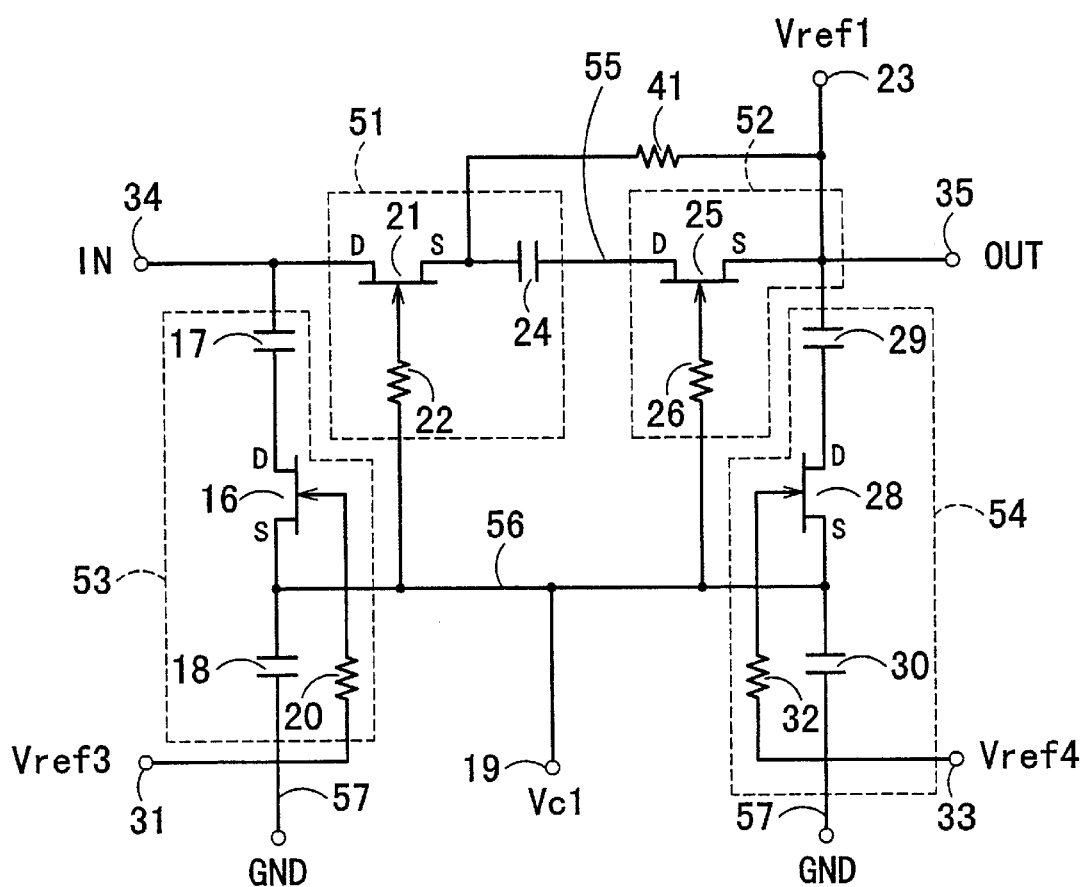
FIG. 17 is a circuit diagram showing the detailed configuration of the amplifier according to the fifth embodiment of the present invention wherein the field effect transistors 21 and 25 as series variable resistors are chosen to have different threshold voltages so that the field effect transistors 21 and 25 acting as the respective series variable resistors can be operated in a shifting manner with the application of the same reference voltage and the same gain control voltage.
Figure 19:
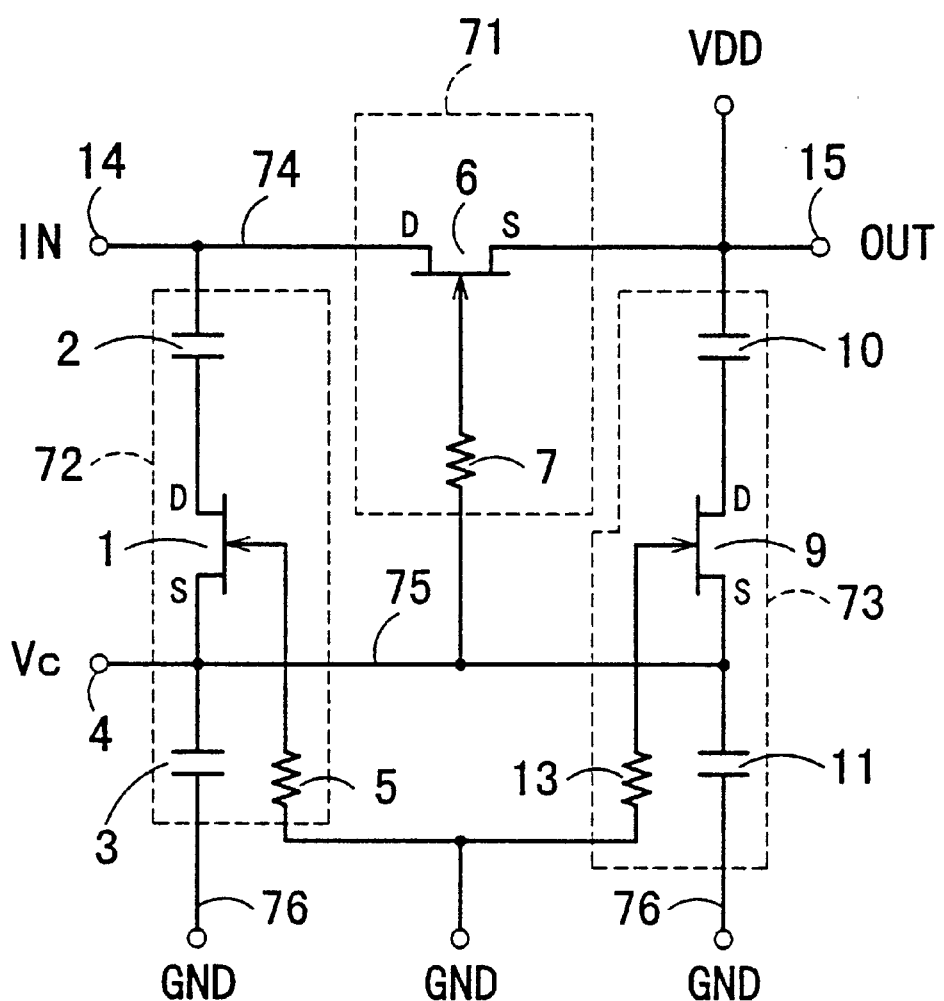
FIG. 19 is a circuit diagram showing the configuration of an amplifier according to the prior art.
Figure 20:
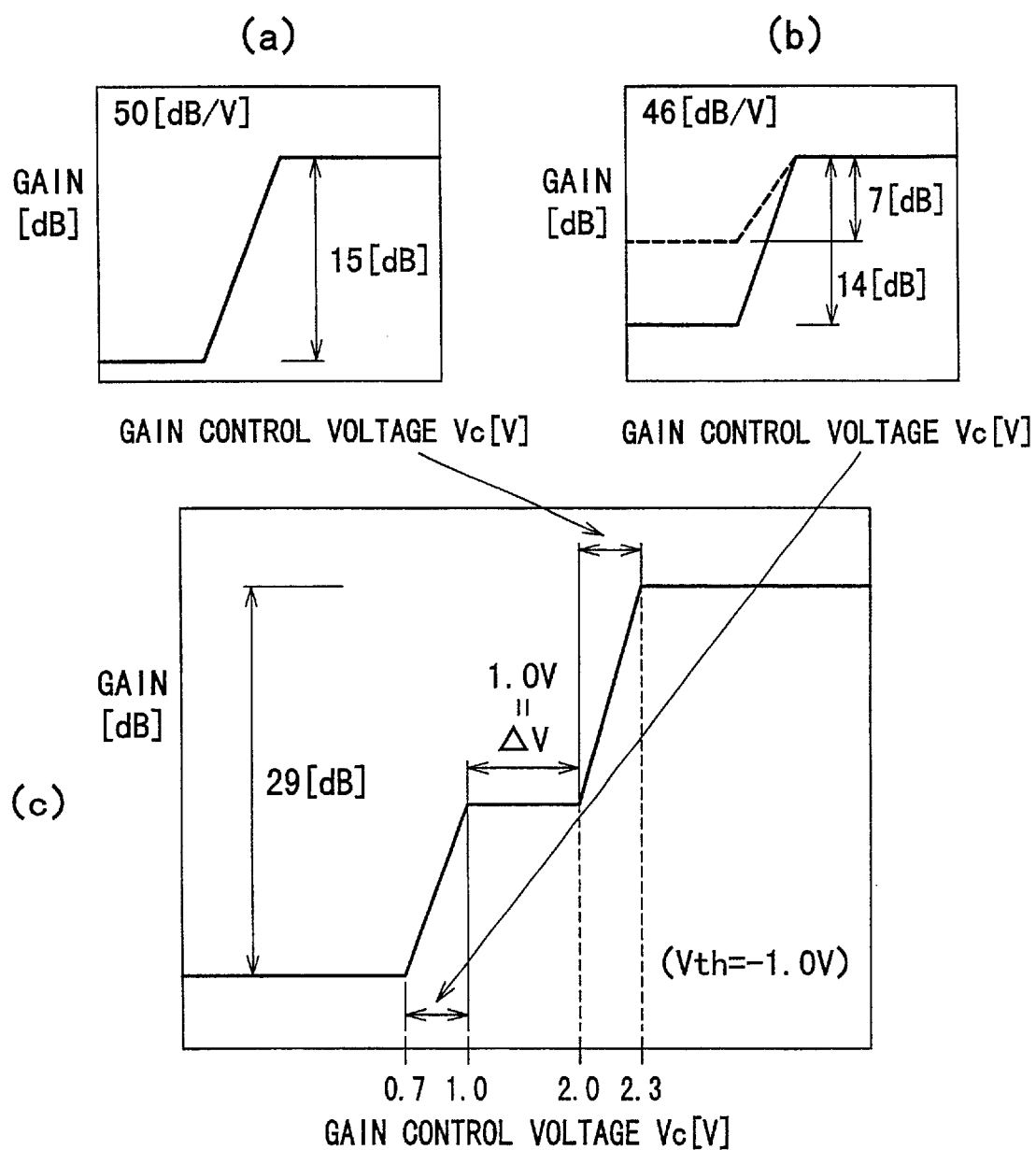
FIG. 20 is a diagram showing gain control characteristics for the amplifier of FIG. 19 when the threshold voltage Vth of each of the field effect transistors 6, 1, and 9 is −1.0 V.
Figure 21:
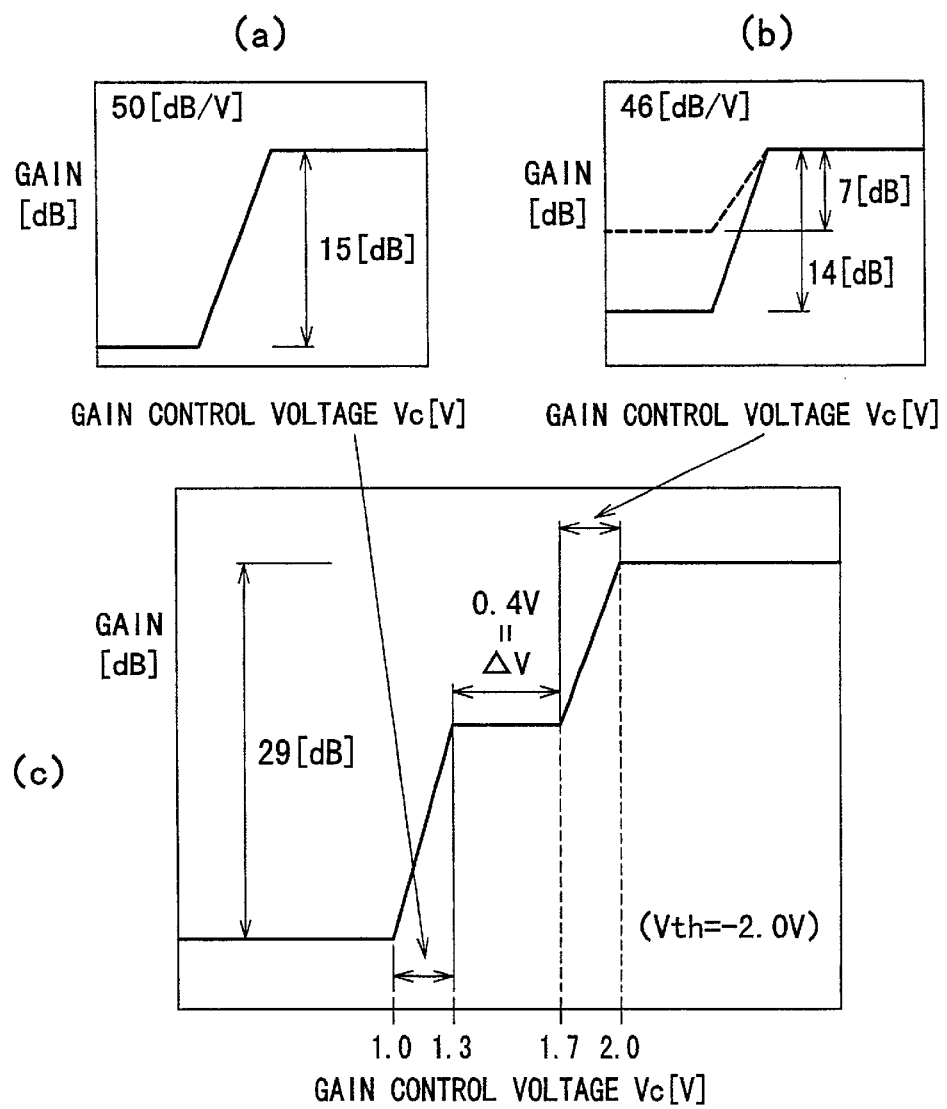
FIG. 21 is a diagram showing gain control characteristics for the amplifier of FIG. 19 when the threshold voltage Vth of each of the field effect transistors 6, 1, and 9 is −2.0 V.
Figure 22:
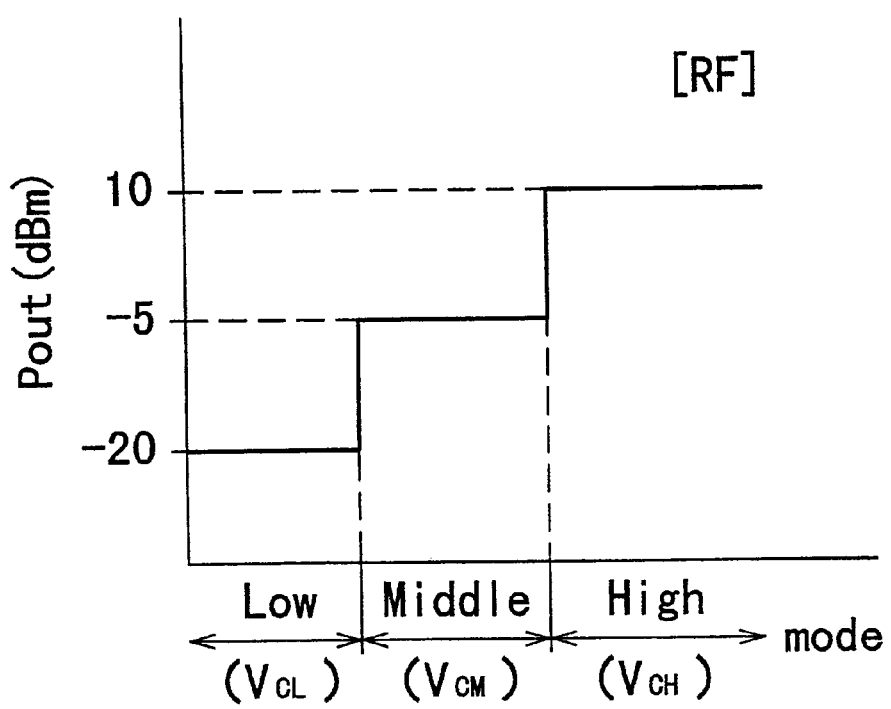
FIG. 22 is a diagram showing the gain control voltage versus step control characteristic of an amplifier used in a prior art high frequency section.
Figure 23:
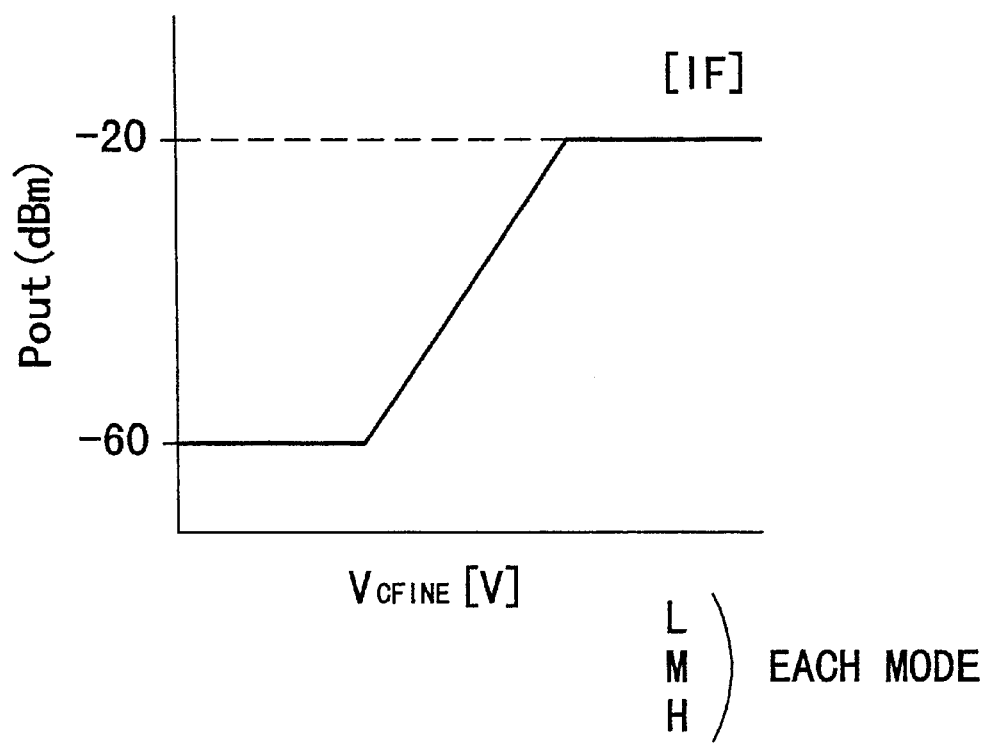
FIG. 23 is a diagram showing the gain control voltage versus continuous control characteristic of an amplifier used in a prior art intermediate frequency section.
Figure 24:
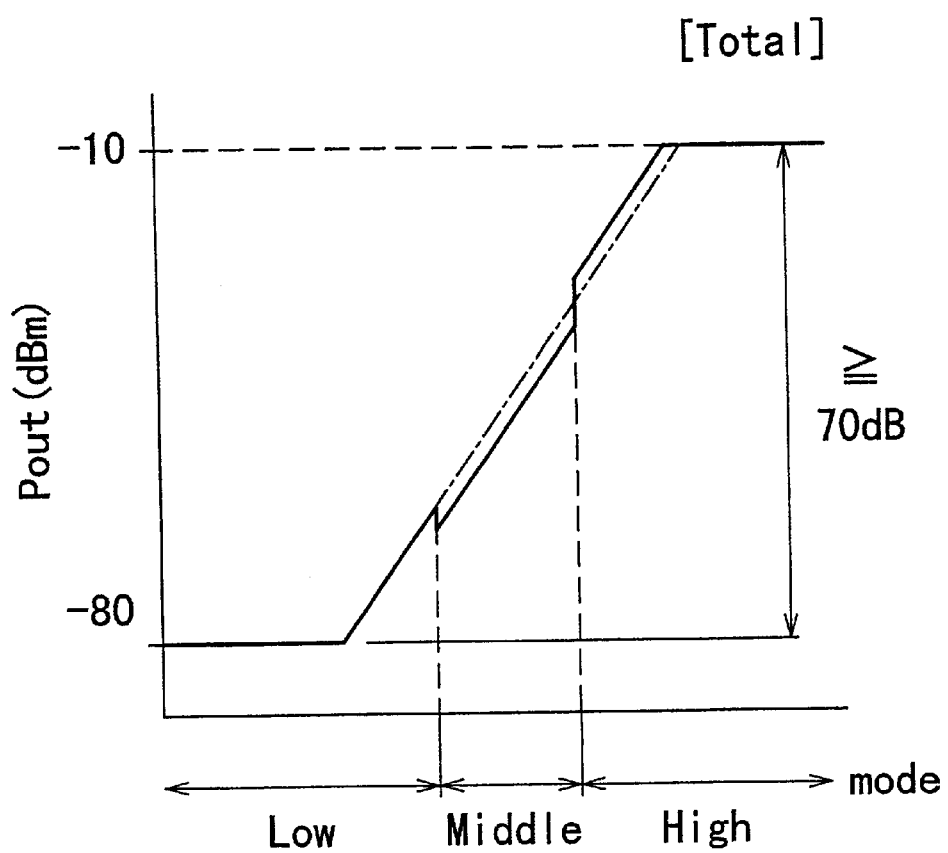
FIG. 24 is a gain control characteristic diagram when two kinds of amplifiers are combined in a prior art mobile communication terminal transmitter.

Further, in the above third embodiment, the reference voltage application terminals 23 and 27 are provided so that different voltages can be applied to the source electrodes of the field effect transistors 21 and 25 acting as the series variable resistors 51 and 52, respectively, but alternatively, the same reference voltage and the same gain control voltage may be applied to the field effect transistors 21 and 25 acting as the series variable resistors 51 and 52, as shown in FIG. 16 or 17, and the shift operation may be accomplished by constructing the field effect transistors 21 and 25 from field effect transistors whose threshold voltages are different by a value equivalent to the width of the linear gain control operation voltage range (fifth embodiment). In this case, while the number of processing steps increases, the number of voltage application terminals can be reduced, and the circuit configuration can thus be simplified, as shown in FIGS. 16 and 17. Further, since the same reference voltage is applied to the source electrodes of the field effect transistors 21 and 25 acting as the series variable resistors 51 and 52, precise linear gain control can be achieved even when there occurs a fluctuation in the reference voltage. The resistor 41, inserted between the reference voltage application terminal 23 and the source electrodes of the field effect transistors 21 and 25 forming the series variable resistors 51 and 52, acts to prevent the penetration of high frequency signals.

Furthermore, as shown in FIG. 18, the reference voltage may be applied through the bias resistors 41, 39, and 40. In this case, the circuit configuration can be further simplified since only one reference voltage application terminal needs to be provided. The bias resistors 41, 39, and 40 each act to prevent the penetration of high frequency signals.

Each of the above embodiments has employed a configuration in which two variable resistors, the series variable resistor 51 at the input side and the series variable resistor 52 at the output side, each implemented by a field effect transistor, are connected in a multiple stage configuration, but it will be recognized that a larger number of variable resistors may be connected in a multiple stage configuration; as the number of variable resistors connected in series in the multiple state configuration increases, the linear gain control range for the control voltage can be increased correspondingly, because the linear operation ranges of the series variable resistors can be concatenated.

Further, in the above embodiments, no components have been inserted in parallel with the drain/source electrodes of the field effect transistors 21, 25, 16, and 28 forming the variable resistors 51, 52, 53, and 54, but in order to suppress variations in resistivity among the field effect transistors 21, 25, 16, and 28 and to control the variable resistance range of each transistor, a resistor or like component may be inserted in parallel with the drain/source electrodes of each of the field effect transistors 21, 25, 16, and 28. This serves to stabilize the gain control amount of each variable resistor, and achieves extremely precise gain control.

In the above embodiments, the field effect transistors 21, 25, 16, and 28 acting as the variable resistors 51, 52, 53, and 54 are each configured to have a single gate, but transistors having two or more gates (multi-gate type) may be used; as the number of gates increases, the gain increases and, even for high frequency input signals, the gain can be controlled while suppressing degradation of the distortion characteristic.

When the field effect transistors 21, 25, 16, and 28 forming the variable resistors 51, 52, 53, and 54 are all of the single-gate type, the field effect transistors 21, 25, 16, and 28 need not necessarily be chosen to have the same gate width, but if they are chosen to have the same gate width, the combined gain control characteristic of the two parallel variable resistors 53 and 54 can be made to match the gain control characteristic of each of the two series variable resistors 51 and 52, and the linearity of the gain control can be greatly enhanced.

Furthermore, the above embodiments have each dealt with the configuration in which the field effect transistors 21, 25, 16, and 28 are used for the variable resistors 51, 52, 53, and 54, but the present invention is not limited to this particular configuration; for example, other devices such as diodes may be used.

According to the circuit configuration of the amplifier having two or more series variable resistors as described in each of the third and subsequent embodiments, not only can continuous gain control be performed, but steplike gain control can also be performed and, in this case, it can also be used in combination of the continuous control performed in the intermediate frequency section, as is practiced in the first or second embodiment. By so doing, the gain control range of the step control increases compared with the first or second embodiment, and the gain control range as a whole can be further increased.

The amplifiers so far described can be applied not only to CDMA systems but also to various other mobile communication systems (PDG, GSM, PCS, Wideband-CDMA, DCS, PHS, etc.).

What is claimed is:

1. An amplifier comprising:

a signal line containing a series first variable resistor and connecting between a signal input part and a signal output part;

parallel second and third variable resistors connected between a ground line and said signal input part and said signal output part, respectively;

a gain control line connected to said first, second, and third variable resistors;

first, second, and third reference voltage application parts connected to said first, second, and third variable resistors, respectively; and a gain control voltage application part connected to each of said first, second, and third variable resistors, via said gain control line.

2. An amplifier according to claim 1, wherein said first, second, and third variable resistors are constructed from first, second, and third field effect transistors whose gates, at least, are connected to first, second, and third resistors, respectively, and said gate of said first field effect transistor of said first variable resistor is connected to said gain control voltage application part via said first resistor and via said gain control line.

3. An amplifier according to claim 2, wherein said first, second, and third field effect transistors of said first, second, and third variable resistors, respectively, are all single-gate devices.

4. An amplifier according to claim 3, wherein said first, second, and third field effect transistors of said first, second, and third variable resistors are chosen to have the same gate width.

5. An amplifier according to claim 2, wherein said first field effect transistor of said first variable resistor is a multi-gate device.

6. An amplifier according to claim 1, wherein a gain control voltage section where gain control cannot be performed, existing between a gain control voltage range where said first variable resistor performs a linear gain control operation and a gain control voltage range where said second and third variable resistors perform a linear gain control operation, is smaller in width than 0.15 V.

7. An amplifier according to claim 1, wherein the values of voltages applied to said second and third reference voltage application parts are so set that a gain control voltage range where said second and third variable resistors perform a linear gain control operation becomes continuous with a gain control voltage range where said first variable resistor performs a linear gain control operation.

8. An amplifier according to claim 2, wherein a common reference voltage is applied to said gates of said second and third field effect transistors of said second and third variable resistors via the respective said second and third resistors.

9. An amplifier comprising:
   a signal line containing at least series first and second variable resistors and connecting between a signal input part and a signal output part;
   parallel third and fourth variable resistors connected between a ground line and said signal input part and said signal output part, respectively;
   a gain control line connected to said first, second, third, and fourth variable resistors;
   first, second, third, and fourth reference voltage application parts connected to said first, second, third and fourth variable resistors, respectively; and
   a gain control voltage application part connected to each of said first, second, third, and fourth variable resistors via said gain control line.

10. An amplifier according to claim 9, wherein said first, second, third, and fourth variable resistors are constructed from first, second, third, and fourth field effect transistors whose gates, at least, are connected to said first, second, third, and fourth resistors, respectively, and said gates of said first and second field effect transistors of said first and second variable resistors are connected to said gain control voltage application part via the respective said first and second resistors and via said gain control line.

11. An amplifier according to claim 10, wherein said gates of said third and fourth field effect transistors of said third and fourth variable resistors respectively are connected to said third and fourth reference voltage application parts via the respective said third and fourth resistors.

12. An amplifier according to claim 11, wherein sources of said first and second field effect transistors of said first and second variable resistors are connected to said first and second reference voltage application parts, respectively, and said first and second variable resistors are connected in series via a capacitor.

13. An amplifier according to claim 12, wherein said sources of said third and fourth field effect transistors of said third and fourth variable resistors are connected to said gain control voltage application part via said gain control line.

14. An amplifier according to claim 13, wherein drains of said third and fourth field effect transistors of said third and fourth variable resistors are connected to said signal line via first and second capacitors, respectively.

15. An amplifier according to claim 13, wherein said sources of said third and fourth field effect transistors of said third and fourth variable resistors are connected to a base potential part via third and fourth capacitors, respectively, and via a ground line.

16. An amplifier according to claim 9, wherein a voltage applied to said first reference voltage application part is higher than a voltage applied to said second reference voltage application part.

17. An amplifier according to claim 9, wherein a voltage applied to said first reference voltage application part is higher than a voltage applied to said second reference voltage application part by a value equivalent to a gain control voltage range where said second variable resistor performs a linear gain control operation.

18. An amplifier according to claim 9, wherein the values of voltages applied to said third and fourth reference voltage application parts are so set that a gain control voltage range where said third and fourth variable resistors perform a linear gain control operation becomes continuous with a gain control voltage range where said first and second variable resistors perform a linear gain control operation.

19. An amplifier according to claim 10, wherein a common reference voltage is applied to said gates of said third and fourth field effect transistors of said third and fourth variable resistors via the respective said third and fourth resistors.

20. An amplifier according to claim 10, wherein:
   said first and second field transistors further comprise at least one source;
   a fifth resistor is inserted between the sources of said first and second field effect transistors of said first and second variable resistors;
   a sixth resistor is inserted between said source of said second field effect transistor of said second variable resistor and a part connected to said gates of said third and fourth field effect transistors of said third and fourth variable resistors via the respective said third and fourth resistors;
   a seventh resistor is inserted between a base potential part and said part connected to said gates of said third and fourth field effect transistors of said third and fourth variable resistors via the respective said third and fourth resistors; and
   a reference voltage application part is connected to said source of said first field effect transistor of said first variable resistor.

21. An amplifier according to claim 20, wherein said fifth resistor, which is inserted between said sources of said first and second field effect transistors of said first and second variable resistors, said sixth resistor, which is inserted between said source of said second field effect transistor of said second variable resistor and said part connected to said gates of said third and fourth field effect transistors of said third and fourth variable resistors via the respective said third and fourth resistors, and said seventh resistor, which is inserted between said base potential part and said part connected to said gates of said third and fourth field effect transistors of said third and fourth variable resistors via the respective said third and fourth resistors, each have a resistance value capable of preventing penetration of a high frequency signal from each part connected thereto.

22. An amplifier according to claim 20, wherein said fifth resistor, which is inserted between said sources of said first and second field effect transistors of said first and second variable resistors, said sixth resistor, which is inserted between said source of said second field effect transistor of said second variable resistor and said part connected to said gates of said third and fourth field effect transistors of said third and fourth variable resistors via the respective said third and fourth resistors, and said seventh resistor, which is inserted between said base potential part and said part connected to said gates of said third and fourth field effect transistors of said third and fourth variable resistors via the respective said third and fourth resistors, each have a resistance value of about 5 kΩ or higher.

23. An amplifier according to claim 10, wherein said first, second, third, and fourth field effect transistors of said first, second, third, and fourth variable resistors are all single-gate devices and are chosen to have the same gate width.

24. An amplifier according to claim 10, wherein said first and second field effect transistors of said first and second variable resistors are multi-gate devices.

25. An amplifier comprising:
- a signal line containing at least series first and second variable resistors and connecting between a signal input part and a signal output part;
- parallel third and fourth variable resistors connected between a ground line and said signal input part and said signal output part, respectively;
- a first gain control line connected to said first variable resistor;
- a first gain control voltage application part connected to said first variable resistor via said first gain control line;
- a second gain control line connected to said second, third and fourth variable resistors;
- a second gain control voltage application part connected to said second, third, and fourth variable resistors via said second gain control line (59);
- a reference voltage application part connected to said first and second variable resistors; and
- first and second reference voltage application parts connected to said third and fourth variable resistors, respectively.

26. An amplifier according to claim 25, wherein said first, second, third, and fourth variable resistors are constructed from first, second, third and fourth field effect transistors whose gates, at least, are connected to first, second, third, and fourth resistors, respectively, and said gate of said first field effect transistor of said first variable resistor is connected to said first gain control voltage application part via said first resistor and via the first gain control line, while said gate of said second field effect transistor of said second variable resistor is connected to said second gain control voltage application part via said second resistor and via said second gain control line.

27. An amplifier according to claim 26, wherein said gates of said third and fourth field effect transistors of said third and fourth variable resistors are respectively connected to said first and second reference voltage application parts via said third and fourth resistors.

28. An amplifier according to claim 27, wherein a fifth resistor is inserted between said sources of said first and second field effect transistors of said first and second variable resistors, said reference voltage application part is connected to said source of said second variable resistor, and said first and second variable resistors are connected in series via a first capacitor.

29. An amplifier according to claim 28, wherein said sources of said third and fourth field effect transistors of said third and fourth variable resistors are connected to said second gain control voltage application part via said second gain control line.

30. An amplifier according to claim 29, wherein drains of said third and fourth field effect transistors of said third and fourth variable resistors are connected to said signal line via second and third capacitors, respectively.

31. An amplifier according to claim 29, wherein said sources of said third and fourth field effect transistors of said third and fourth variable resistors are connected to a base potential part via fourth and fifth capacitors, respectively, and via said ground line.

32. An amplifier according to claim 25, wherein a voltage applied to said second gain control voltage application part is higher than a voltage applied to said first gain control voltage application part.

33. An amplifier according to claim 25, wherein a voltage applied to said second gain control voltage application part is higher than a voltage applied to said first gain control voltage application part by a value equivalent to a gain control voltage range where said second variable resistor performs a linear gain control operation.

34. An amplifier according to claim 25, wherein the values of voltages applied to said first and second reference voltage application parts are so set that a gain control voltage range where said third and fourth variable resistors perform a linear gain control operation becomes continuous with a gain control voltage range where said first and second variable resistors perform a linear gain control operation.

35. An amplifier according to claim 26, wherein a common reference voltage is applied to gates of said third and fourth field effect transistors of said third and fourth variable resistors via the respective third and fourth resistors.

36. An amplifier according to claim 26, wherein:
- a fifth resistor is inserted between sources of said first and second field effect transistors of said first and second variable resistors;
- a sixth resistor is inserted between said source of said second field effect transistor of said second variable resistor and a part connected to said gates of said third and fourth field effect transistors of said third and fourth variable resistors via the respective said third and fourth resistors;
- a seventh resistor is inserted between a base potential part and said part connected to said gates of said third and fourth field effect transistors of said third and fourth variable resistors via the respective said third and fourth resistors (20) and (32); and
- said reference voltage application part is connected to said source of said second field effect transistor of said second variable resistor.

37. An amplifier according to claim 36, wherein said fifth resistor, which is inserted between said sources of said first and second field effect transistors of said first and second variable resistors, said sixth resistor, which is inserted between said source of said second field effect transistor of said second variable resistor and said part connected to said gates of said third and fourth field effect transistors of said third and fourth variable resistors via the respective said third and fourth resistors, and said seventh resistor, which is inserted between said base potential part and said part connected to said gates of said third and fourth field effect transistors of said third and fourth variable resistors via said third and fourth resistors, respectively, each have a resistance value capable of preventing penetration of a high frequency signal from each part connected thereto.

38. An amplifier according to claim 36, wherein said fifth resistor, which is inserted between said sources of said first and second field effect transistors of said first and second variable resistors, said sixth resistor, which is inserted between said source of said second field effect transistor of said second variable resistor (52) and said part connected to the gates of said third and fourth field effect transistors of said third and fourth variable resistors via the respective said third and fourth resistors, and said seventh resistor, which is inserted between said base potential part and said part connected to said gates of said third and fourth field effect transistors of said third and fourth variable resistors via the respective said third and fourth resistors, each have a resistance value of about 5 k$\Omega$ or higher.

39. An amplifier according to claim 25, wherein said first, second, third and fourth variable resistors are constructed from first, second, third, and fourth field effect transistors whose gates, at least, are connected to said first, second, third and fourth resistors, respectively, and wherein an eighth resistor is inserted between said second gain control line, which is connected to said gate of said second field effect transistor of said second variable resistor via said second resistor and also to said sources of said third and fourth field effect transistors of said third and fourth variable resistors, and said first gain control line, which is connected to said gate of said first field effect transistor of said first variable resistor via said first resistor, a ninth resistor is inserted between a base potential part and said first gain control line, which is connected to said gate of said first field effect transistor of said first variable resistor via said first resistor, and said second gain control voltage application part is connected to said second gain control line.

40. An amplifier according to claim 39, wherein said eighth resistor, which is inserted between said second gain control line, connected to said gate of said second field effect transistor of said second variable resistor via said second resistor and also to said sources of said third and fourth field effect transistors of said third and fourth variable resistors, and said first gain control line connected to said gate of said first field effect transistor of said first variable resistor via said first resistor, and said ninth resistor, which is inserted between said base potential part and said first gain control line connected to the gate of said first field effect transistor of said first variable resistor via said first resistor, each have a resistance value capable of preventing penetration of a high frequency signal from each part connected thereto.

41. An amplifier according to claim 39, wherein said eighth resistor, which is inserted between said second gain control line, connected to said gate of said second field effect transistor of said second variable resistor via said second resistor and also to said sources of said third and fourth field effect transistors of said third and fourth variable resistors, and said first gain control line connected to said gate of said first field effect transistor of said first variable resistor via said first resistor, and said eighth resistor, which is inserted between said base potential part and said first gain control line connected to said gate of said first field effect transistor of said first variable resistor via said first resistor, each have a resistance value of about 5 kΩ or higher.

42. An amplifier according to claim 26, wherein said first, second, third, and fourth field effect transistors of said first, second, third, and fourth variable resistors are all single-gate devices and are chosen to have the same gate width.

43. An amplifier according to claim 26, wherein said first and second field effect transistors of said first and second variable resistors are multi-gate devices.

44. An amplifier comprising:
a signal line containing at least series first and second variable resistors and connecting between a signal input part and a signal output part;
parallel second and third variable resistors connected between a ground line and said signal input part and said signal output part, respectively;
a gain control line connected to said first, second, third and fourth variable resistors;
a gain control voltage application part connected to said first, second, third and fourth variable resistors via said gain control line;
a first reference voltage application part connected to said first and second variable resistors; and
second and third reference voltage application parts respectively connected to said third and fourth variable resistors.

45. An amplifier according to claim 44, wherein said first, second, third and fourth variable resistors, are constructed from first, second, third, and fourth field effect transistors whose gates, at least, are connected to first, second, third, and fourth resistors, respectively, and the gates of said first and second field effect transistors of said first and second variable resistors are connected to said gain control voltage application part via the respective said first and second resistors and via said gain control line.

46. An amplifier according to claim 45, wherein the gates of said third and fourth field effect transistors of said third and fourth variable resistors are respectively connected to said second and third reference voltage application parts via the respective said third and fourth resistors.

47. An amplifier according to claim 46, wherein a fifth resistor is inserted between said sources of said first and second field effect transistors of said first and second variable resistors, and said first reference voltage application part is connected to said source of said second variable resistor, and said first and second variable resistors are connected in series via a first capacitor.

48. An amplifier according to claim 47, wherein said sources of said third and fourth field effect transistors of said third and fourth variable resistors are connected to said gain control voltage application part via said gain control line.

49. An amplifier according to claim 48, wherein drains of said third and fourth field effect transistors of said third and fourth variable resistors are connected to said signal line via second and third capacitors, respectively.

50. An amplifier according to claim 48, wherein said sources of said third and fourth field effect transistors of said third and fourth variable resistors are connected to a base potential part via fourth and fifth capacitors, respectively, and via said ground line.

51. An amplifier according to claim 44, wherein said first field effect transistor of said first variable resistor is chosen to have a threshold voltage higher than that of said second field effect transistor of said second variable resistor.

52. An amplifier according to claim 44, wherein said first field effect transistor of said first variable resistor is chosen to have a threshold voltage higher than that of said second field effect transistor of said second variable resistor by a value equivalent to a gain control voltage range where said second variable resistor performs a linear gain control operation.

53. An amplifier according to claim 44, wherein the values of voltages applied to said second and third reference voltage application parts are so set that a gain control voltage range where said third and fourth variable resistors perform a linear gain control operation becomes continuous with a gain control voltage range where said first and second variable resistors perform a linear gain control operation.

54. An amplifier according to claim 45, wherein a common reference voltage is applied to the gates of said third and fourth field effect transistors of said third and fourth variable resistors via said third and fourth resistors connected thereto.

55. An amplifier according to claim 45, wherein:
a fifth resistor is inserted between said sources of said first and second field effect transistors of said first and second variable resistors;
a sixth resistor is inserted between said source of said second field effect transistor of said second variable resistor and a part connected to the gates of said third and fourth field effect transistors of said third and fourth variable resistors via the respective third and fourth resistors;
a seventh resistor is inserted between a base potential part and said part connected to the gates of said third and fourth field effect transistors of said third and fourth variable resistors via the respective said third and fourth resistors; and said first reference voltage application part is connected to said source of said second field effect transistor of said second variable resistor.

56. An amplifier according to claim 55, wherein said fifth resistor, which is inserted between said sources of said first and second field effect transistors of said first and second variable resistors, said sixth resistor, which is inserted between said source of said second field effect transistor of said second variable resistor and said part connected to the gates of said third and fourth field effect transistors of said second and third variable resistors via the respective said third and fourth resistors and said seventh resistor, which is inserted between said base potential part and said part connected to the gates of said third and fourth field effect transistors of said third and fourth variable resistors via the respective said third and fourth resistors, each have a resistance value capable of preventing penetration of a high frequency signal from each part connected thereto.

57. An amplifier according to claim 55, wherein said fifth resistor, which is inserted between said sources of said first and second field effect transistors of said first and second variable resistors, said sixth resistor, which is inserted between said source of said second field effect transistor of said second variable resistor and said part connected to the gates of said third and fourth field effect transistors of said third and fourth variable resistors via the respective said third and fourth resistors, and said seventh resistor, which is inserted between said base potential part and said part connected to the gates of said third and fourth field effect transistors of said third and fourth variable resistors via the respective said third and fourth resistors, each have a resistance value of about 5 k$\Omega$ or higher.

58. An amplifier according to claim 45, wherein said first, second, third, and fourth field effect transistors of said first, second, third, and fourth variable resistors are all single-gate devices and are chosen to have the same gate width.

59. An amplifier according to claim 45, wherein said first and second field effect transistors of said first and second variable resistors are multi-gate devices.

* * * * *